US012581631B2

(12) United States Patent
Kawaguchi et al.

(10) Patent No.: US 12,581,631 B2
(45) Date of Patent: Mar. 17, 2026

(54) COMPONENT SUPPLY APPARATUS

(71) Applicant: Panasonic Intellectual Property Management Co., Ltd., Osaka (JP)

(72) Inventors: Satoshi Kawaguchi, Yamanashi (JP); Yoshinori Isobata, Fukuoka (JP); Kazunari Mishima, Fukuoka (JP); Tatsuo Yamamura, Fukuoka (JP); Kunimi Tsuzurugi, Fukuoka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 373 days.

(21) Appl. No.: 18/249,551

(22) PCT Filed: Oct. 21, 2021

(86) PCT No.: PCT/JP2021/039002
§ 371 (c)(1),
(2) Date: Apr. 19, 2023

(87) PCT Pub. No.: WO2022/085768
PCT Pub. Date: Apr. 28, 2022

(65) Prior Publication Data
US 2023/0397385 A1 Dec. 7, 2023

(30) Foreign Application Priority Data
Oct. 22, 2020 (JP) ................................. 2020-177586

(51) Int. Cl.
*H05K 13/02* (2006.01)
*B65H 37/00* (2006.01)
*H05K 13/04* (2006.01)
(52) U.S. Cl.
CPC ........... *H05K 13/02* (2013.01); *B65H 37/002* (2013.01); *H05K 13/0419* (2018.08)

(58) Field of Classification Search
CPC ... H05K 13/02; H05K 13/0419; B65H 37/002
(Continued)

(56) References Cited

U.S. PATENT DOCUMENTS 8,678,065 B2 * 3/2014 Hwang .............. H05K 13/0419
156/941
2003/0230617 A1 * 12/2003 Saho ................... H05K 13/0419
226/76
(Continued)

FOREIGN PATENT DOCUMENTS

CN 104509234 A * 4/2015 ......... H05K 13/0419
CN 108141997 A * 6/2018 ........... H05K 13/021
(Continued)

OTHER PUBLICATIONS

International Search Report issued in Patent Application No. PCT/JP2021/039002 dated Dec. 21, 2021.
(Continued)

*Primary Examiner* — Rakesh Kumar
(74) *Attorney, Agent, or Firm* — McDonald Hopkins LLC

(57) ABSTRACT

A component supply apparatus includes a tape conveying path that includes, both on an upstream side thereof: a first conveying route into which a carrier tape is inserted; and a second conveying route that is positioned under the first conveying route, the first conveying route and the second conveying route joining each other to guide traveling of the carrier tape in a downstream direction, a first tape conveying part that sequentially conveys the carrier tape in the tape conveying path present more downstream than a position at which the first conveying route and the second conveying route join each other, to a component taking out position in the tape conveying path, a tape holding part that holds the carrier tape in at least a portion of the first conveying route, a second tape conveying part that conveys the carrier tape held by the tape holding part, in the downstream direction of
(Continued)

UPSTREAM SIDE ←——— ——→ DOWNSTREAM SIDE the tape conveying path, a tape holding releasing mechanism that causes the carrier tape held by the tape holding part to drop from the first conveying route onto the second conveying route. The tape holding releasing mechanism operates by using motivity of a driving source of the second tape conveying part.

10 Claims, 17 Drawing Sheets

(58) Field of Classification Search
USPC ........................................................ 221/25
See application file for complete search history.

(56) References Cited

U.S. PATENT DOCUMENTS

| | | | |
|---|---|---|---|
| 2010/0180435 A1 | 7/2010 | Shin et al. | |
| 2019/0200492 A1* | 6/2019 | Kitani .................... | B65H 20/22 |
| 2019/0364704 A1 | 11/2019 | Yanagida | |
| 2023/0397385 A1* | 12/2023 | Kawaguchi ........ | H05K 13/0419 |

FOREIGN PATENT DOCUMENTS

| | | | | |
|---|---|---|---|---|
| JP | 2010147223 A | * | 7/2010 | |
| JP | 2015122474 A | * | 7/2015 | ........... H05K 13/021 |
| JP | 2018174169 A | * | 11/2018 | ............. H05K 13/02 |
| JP | 2019117820 A | * | 7/2019 | ............. B65H 20/22 |
| KR | 987836 B1 | * | 10/2010 | ............. H05K 13/02 |
| KR | 20150060491 A | * | 6/2015 | ........... H05K 13/021 |
| KR | 101563306 B1 | * | 10/2015 | ......... H05K 13/0215 |
| WO | WO-2015076464 A1 | * | 5/2015 | ......... H05K 13/0419 |
| WO | WO-2018087857 A1 | * | 5/2018 | ......... H05K 13/0215 |
| WO | WO-2019026181 A1 | * | 2/2019 | ............. H05K 13/02 |
| WO | WO-2020084975 A1 | * | 4/2020 | ......... H05K 13/0419 |

OTHER PUBLICATIONS

International Preliminary Report on Patentability issued in Patent Application No. PCT/JP2021/039002 dated May 4, 2023, and written Opinion issued in Patent Application No. PCT/JP2021/039002 dated Dec. 21, 2021.

International Search Report issued in Patent Application No. PCT/JP2021/039005 dated Dec. 21, 2021.

International Preliminary Report on Patentability issued in Patent Application No. PCT/JP2021/039005 dated May 4, 2023, and written Opinion issued in Patent Application No. PCT/JP2021/039005 dated Dec. 21, 2021.

Japanese Office Action issued in Japanese Patent Application No. 2022-557609 dated May 20, 2025.

Chinese Office Action issued in Chinese Patent Application No. 202180071520.X dated Jun. 29, 2025.

* cited by examiner

UPSTREAM SIDE ⟵——        ——⟶ DOWNSTREAM SIDE

LEFT DIRECTION ⟵        ⟶ RIGHT DIRECTION

DOWNSTREAM SIDE

UPSTREAM SIDE

UPSTEAM SIDE ←———————→ DOWNSTREAM SIDE

UPSTEAM SIDE ←———————→ DOWNSTREAM SIDE

UPSTEAM SIDE ⟵      ⟶ DOWNSTREAM SIDE

UPSTEAM SIDE ⟵      ⟶ DOWNSTREAM SIDE

UPSTEAM SIDE ⟵          ⟶ DOWNSTREAM SIDE

UPSTEAM SIDE ⟵          ⟶ DOWNSTREAM SIDE

UPSTEAM SIDE ⟵                    ⟶ DOWNSTREAM SIDE

COMPONENT SUPPLY APPARATUS

BACKGROUND

Technical Field

The present disclosure relates to a component supply apparatus that supplies components to a component attaching apparatus.

Background Art

Such a tape feeder is traditionally known as the one that can consecutively supply, after a preceding carrier tape (a preceding tape) storing therein components, a subsequent carrier tape (a subsequent tape) to a component taking out position.

For example, a tape feeder described in Patent Document 1 includes, on the upstream side of a tape conveying path thereof, a tape holding unit that holds a subsequent tape whose tip is inserted into a tape input inlet. The tape holding unit includes a component holding part that is displaceable in the up-and-down direction by an operation of a worker, and is configured to be able to drop downward the subsequent tape being held thereby by displacing the tape holding part in the up-and-down direction.

In this tape feeder, when the preceding tape is discharged and the subsequent tape becomes a preceding tape to start supply of the components, the worker operates the tape holding unit to drop the preceding tape from the tape holding unit to thereby correct the position of the preceding tape. The state is thereby established where the subsequent tape can be replenished. The tape holding unit is thereafter caused to hold a new subsequent tape and the tip thereof is inserted into the tape input inlet to complete replenishment work of the carrier tape.

PRIOR ART DOCUMENT

Patent Document

Patent Document 1: JP2019117820A

SUMMARY OF THE INVENTION

Problems to be Solved by the Invention

For the traditional tape feeder, however, the operation to cause the tape feeder to release downward the preceding tape is manually executed by the worker and the worker may forget to execute the tape release work. In this case, when all the components in the preceding tape are mounted, no part can be replenished into the component attaching apparatus, attaching work by the component attaching apparatus needs to be stopped, and the productivity may be degraded. The switching from the preceding tape to the subsequent tape is manually executed by the worker and it is therefore difficult to automate the supply of the components to the component attaching apparatus or reduce the workers for the supply.

An object of the present disclosure is to solve the above traditional problems and to therefore provide a component supply apparatus capable of improving the productivity and capable of automating the supply of the components to the component attaching apparatus or reducing the workers for the supply.

Means for Solving the Problems

The component supply apparatus of the present disclosure includes a tape conveying path including a first conveying route into which a carrier tape is inserted and a second conveying route that is positioned under the first conveying route, both on an upstream side thereof, and having the first conveying route and the second conveying route joining each other therein to guide traveling of the carrier tape in a downstream direction, a first tape conveying part that sequentially conveys the carrier tape in the tape conveying path, present more downstream than the position at which the first conveying route and the second conveying route join each other, to a component taking out position in the tape conveying path, a tape holding part that holds the carrier tape in at least a portion of the first conveying route, a second tape conveying part that conveys the carrier tape held by the tape holding part, in the downstream direction of the tape conveying path, and a tape holding releasing mechanism that causes the carrier tape held by the tape holding part to drop from the first conveying route onto the second conveying route, and the tape holding releasing mechanism operates by using the motivity of the driving source of the second tape conveying part.

Effects of the Invention

According to the present disclosure, a component supply apparatus can be provided that can improve the productivity and that can automate the supply of the components to the component attaching apparatus or reduce the workers for the supply.

3

Figure 14:
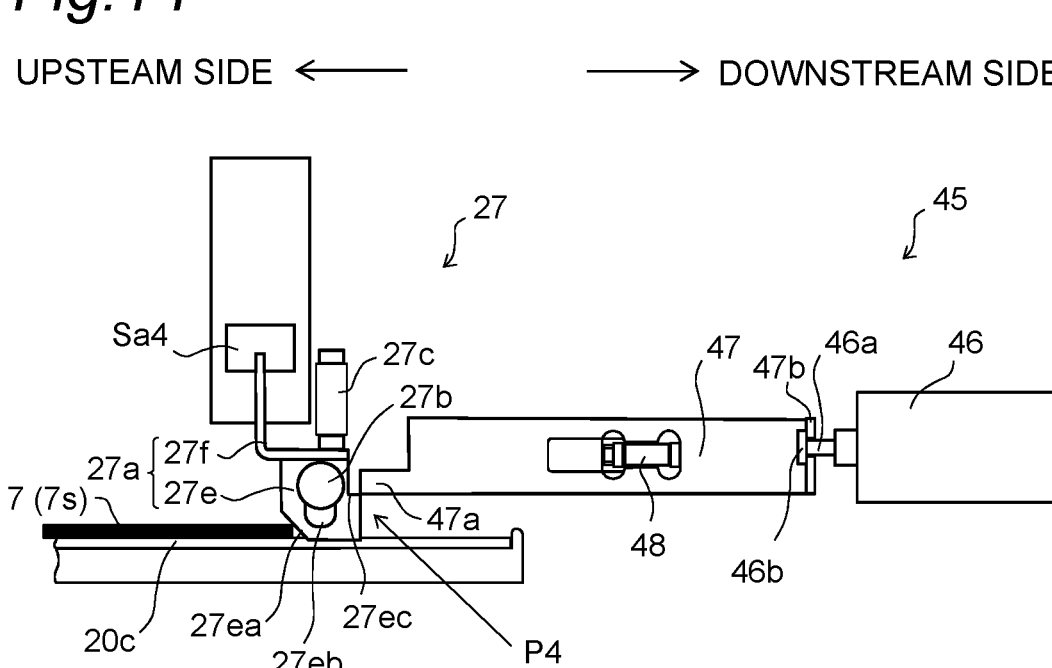

FIG. 14 is a side view showing operations of the shutter and the lock part of the component supply apparatus.

Figure 15:
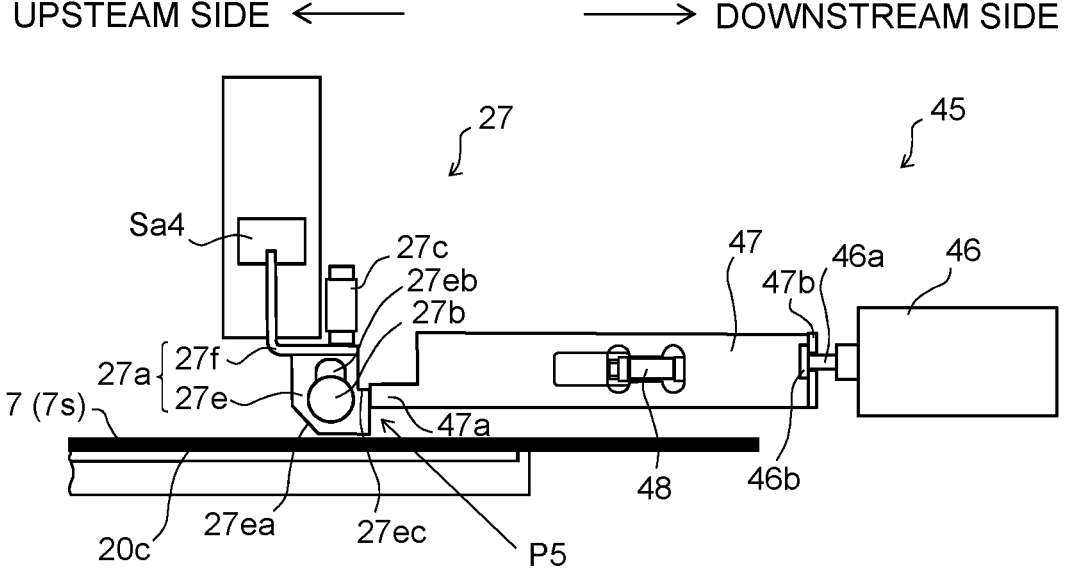

FIG. 15 is a side view showing operations of the shutter and a lock part of the component supply apparatus.

Figure 16:
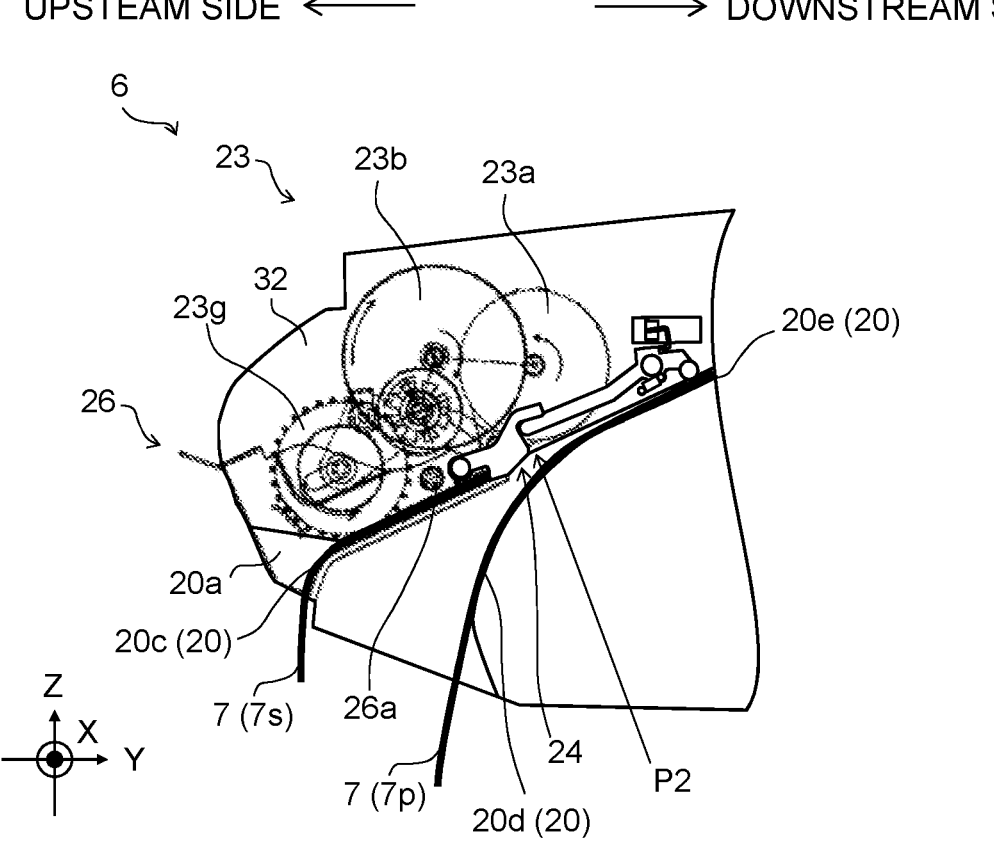

FIG. 16 is a partial enlarged view of a tape stoper part of the component supply apparatus.

Figure 17:
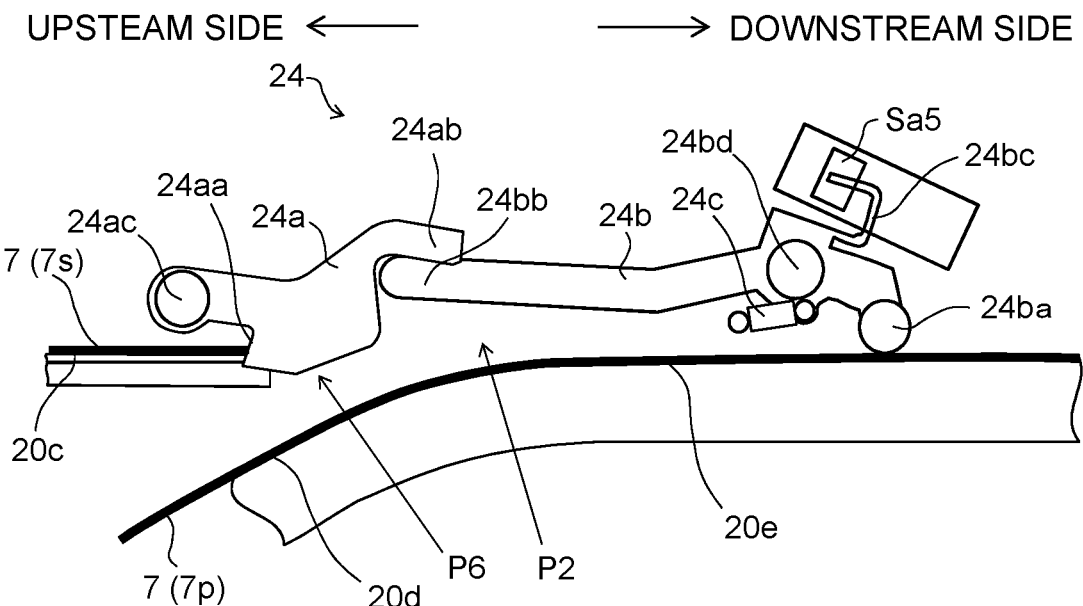

FIG. 17 is a side view showing an operation of the tape stoper part of the component supply apparatus.

Figure 18:
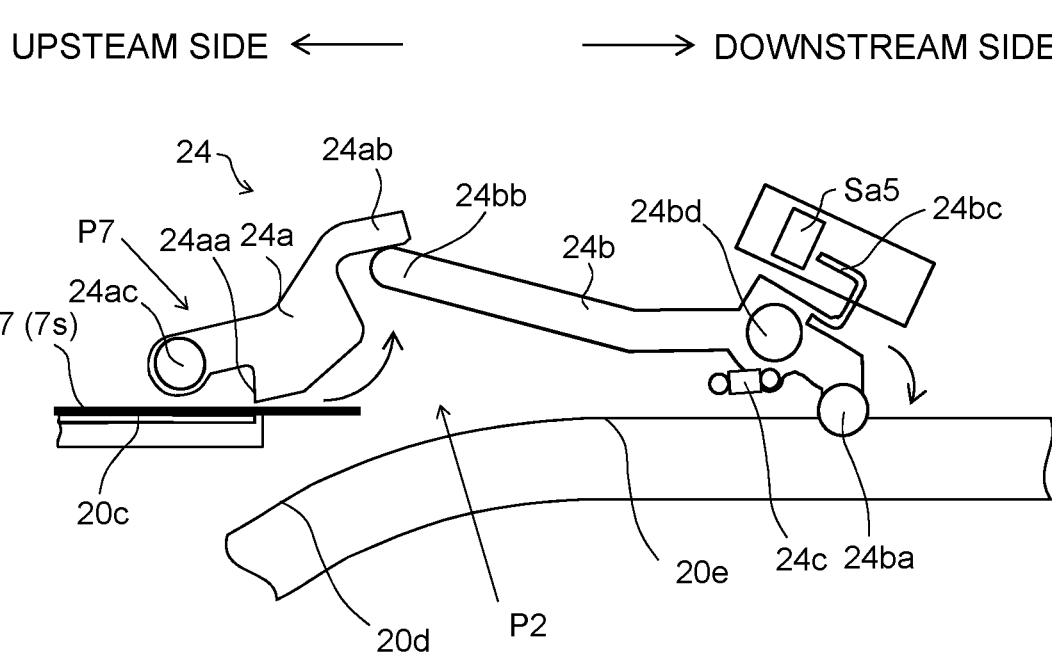

FIG. 18 is a side view showing the operation of the tape stoper part of the component supply apparatus.

Figure 19:
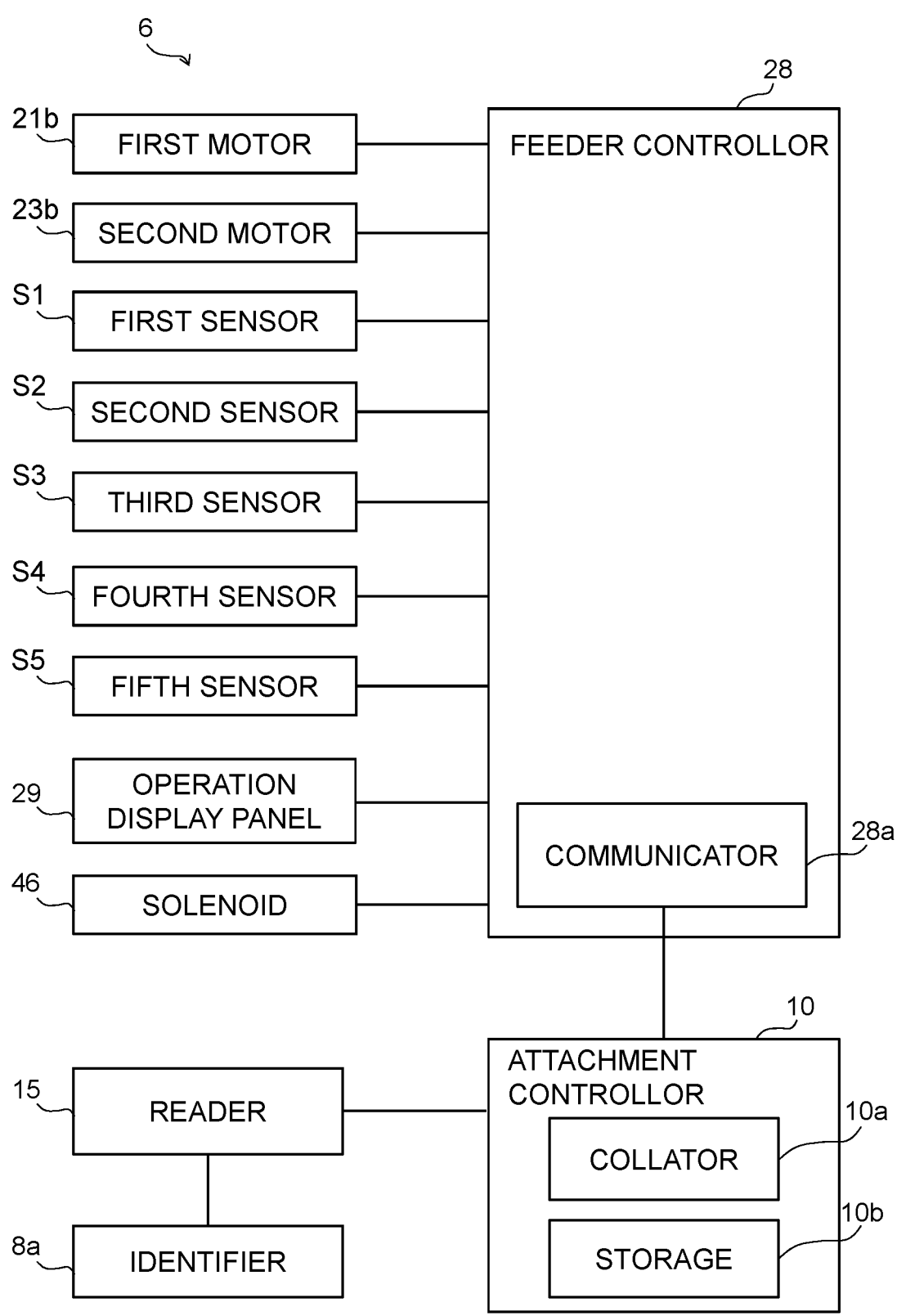

FIG. 19 is a block diagram showing the configuration of a control system of the component supply apparatus.

Figure 20:
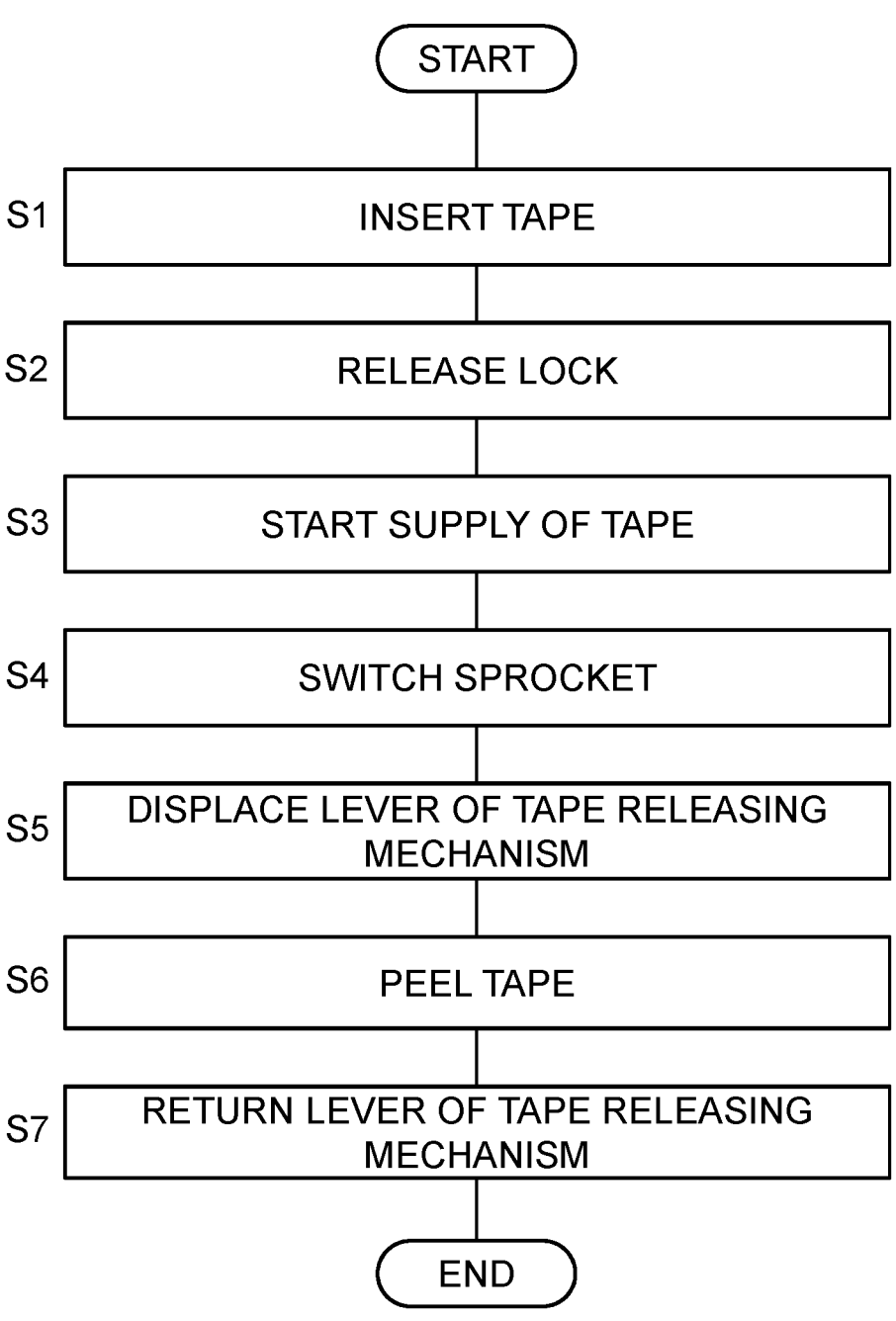

FIG. 20 is a flowchart showing a flow of tape supply of the component supply apparatus.

Figure 21:
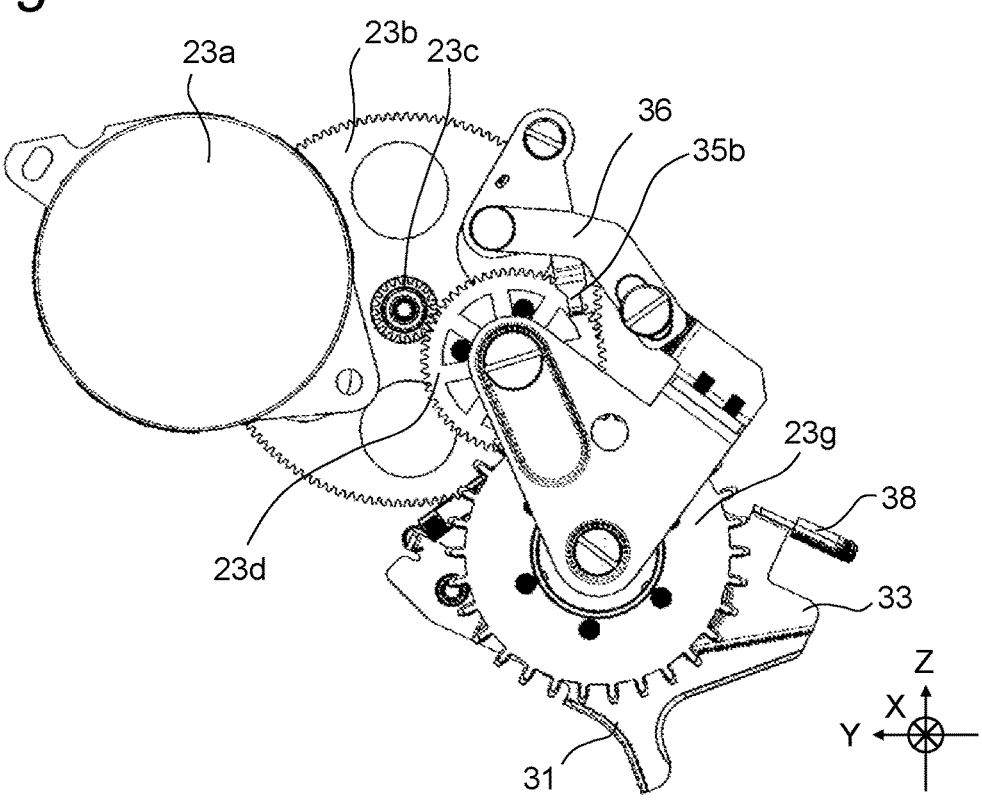

FIG. 21 is a side view showing a modification example of the tape holding releasing mechanism of the component supply apparatus.

Figure 22:
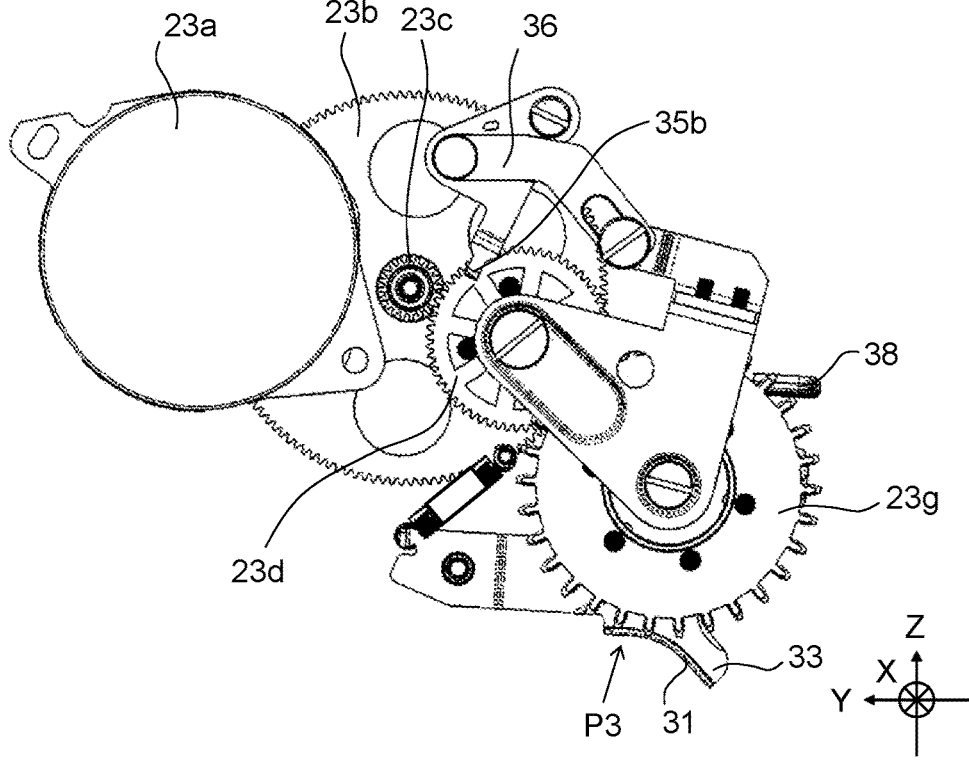

FIG. 22 is a side view showing the modification example of the tape holding releasing mechanism of the component supply apparatus.

Figure 23:
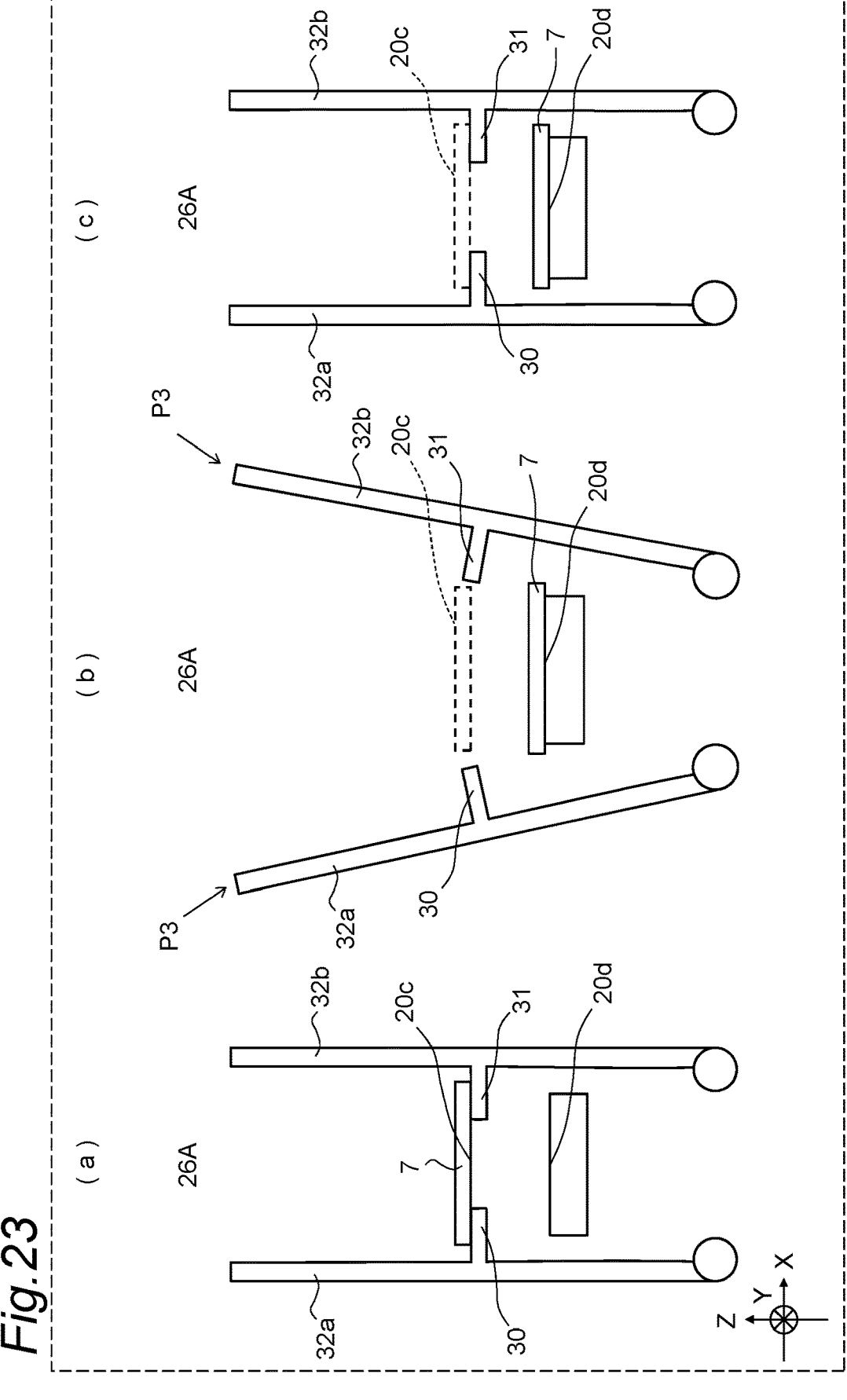

FIG. 23 is an explanatory view explaining releasing of the carrier tape in the modification example, (a) showing the state where a side wall part holds the carrier tape at a tape holding position, (b) showing the state where the carrier tape is dropped by displacement of the side wall part to a release position, (c) showing the state where the side wall part returns to the tape holding position.

DETAILED DESCRIPTION

According to a first aspect of the present disclosure, a component supply apparatus is provided, that includes a tape conveying path including a first conveying route into which a carrier tape is inserted and a second conveying route that is positioned under the first conveying route, both on an upstream side thereof, and having the first conveying route and the second conveying route joining each other therein to guide traveling of the carrier tape in a downstream direction, a first tape conveying part that sequentially conveys the carrier tape in the tape conveying path, present more downstream than the position at which the first conveying route and the second conveying route join each other, to a component taking out position in the tape conveying path, a tape holding part that holds the carrier tape in at least a portion of the first conveying route, a second tape conveying part that conveys the carrier tape held by the tape holding part, in the downstream direction of the tape conveying path, and a tape holding releasing mechanism that causes the carrier tape held by the tape holding part to drop from the first conveying route onto the second conveying route, and in which the tape holding releasing mechanism operates by using the motivity of the driving source of the second tape conveying part.

According to a second aspect of the present disclosure, the component supply apparatus described in the first aspect is provided, in which the second tape conveying part includes a motor capable of rotating forward and backward as a driving source, in which, when the motor rotates forward, the second tape conveying part conveys the carrier tape in the downstream direction of the tape conveying path, and in which, when the motor rotates backward, the tape holding releasing mechanism is thereby driven.

According to a third aspect of the present disclosure, the component supply apparatus described in the second aspect is provided, in which the tape holding part is displaceable from a holding position with which the carrier tape is held to a release position with which the holding of the carrier tape is released, and in which the tape holding releasing mechanism displaces the tape holding part to the release position.

According to a fourth aspect of the present disclosure, the component supply apparatus described in any one of the first aspect to the third aspect is provided, in which the tape holding releasing mechanism includes a ratchet mechanism that is rotated by a driving force of a motor and a lever that is swung by the ratchet mechanism, and in which the tape holding part is displaced to the holding position or the release position by swinging of the lever.

According to a fifth aspect of the present disclosure, the component supply apparatus described in the fourth aspect is provided, in which the release position is a position that is distant upward from the first conveying route.

According to a sixth aspect of the present disclosure, the component supply apparatus described in the fifth aspect is provided, in which the tape holding part includes a movable member that is swingable by the tape holding releasing mechanism, a first support part that supports one lower portion in a width direction of the carrier tape, and a second support part that supports another lower portion in the width direction of the carrier tape and that is fixed on the movable member, and in which the tape holding releasing mechanism swigs the movable member to thereby displace the second support part to a position distant upward from the first conveying route.

According to a seventh aspect of the present disclosure, the component supply apparatus described in the sixth aspect is provided, in which the ratchet mechanism includes a ratchet gear that is rotated by the driving force of the motor and a lever including ratchet pawls that engage with the ratchet gear, in which the lever is connected to an end on the downstream side, of the movable member, and in which, when the motor rotates backward, the ratchet gear engages with the ratchet pawls to swing the lever to thereby swing the movable member.

According to an eighth aspect of the present disclosure, the component supply apparatus described in the fourth aspect is provided, in which the release position is a position that is distant in a lateral direction from the first conveying route.

According to a ninth aspect of the present disclosure, the component supply apparatus described in the eighth aspect is provided, in which the tape holding part includes a first side wall and a second side wall that each are displaceable in a horizontal direction by the tape holding releasing mechanism, a first support part that supports one lower portion in the width direction of the carrier tape and that is fixed on the first side wall, and a second support part that supports another lower portion in the width direction of the carrier tape and that is fixed on the second side wall, and in which the tape holding releasing mechanism displaces the first side wall and the second side wall to thereby displace the first support part and the second support part to positions distant in the lateral direction from the first conveying route.

According to a tenth aspect of the present disclosure, the component supply apparatus described in the ninth aspect is provided, in which the ratchet mechanism includes a ratchet gear that is rotated by the driving force of the motor and a lever including ratchet pawls that engage with the ratchet gear, and in which, when the motor rotates backward, the ratchet gear engages with the ratchet pawls to swing the lever to thereby displace the first side wall and the second side wall.

An exemplary embodiment of a component attaching apparatus according to the present disclosure will be described below with reference to the accompanying drawings. The present disclosure is not limited to the detailed configuration of the following embodiment, and configurations each based on the similar technical idea are encompassed in the present disclosure.

Embodiment

Figure 1:
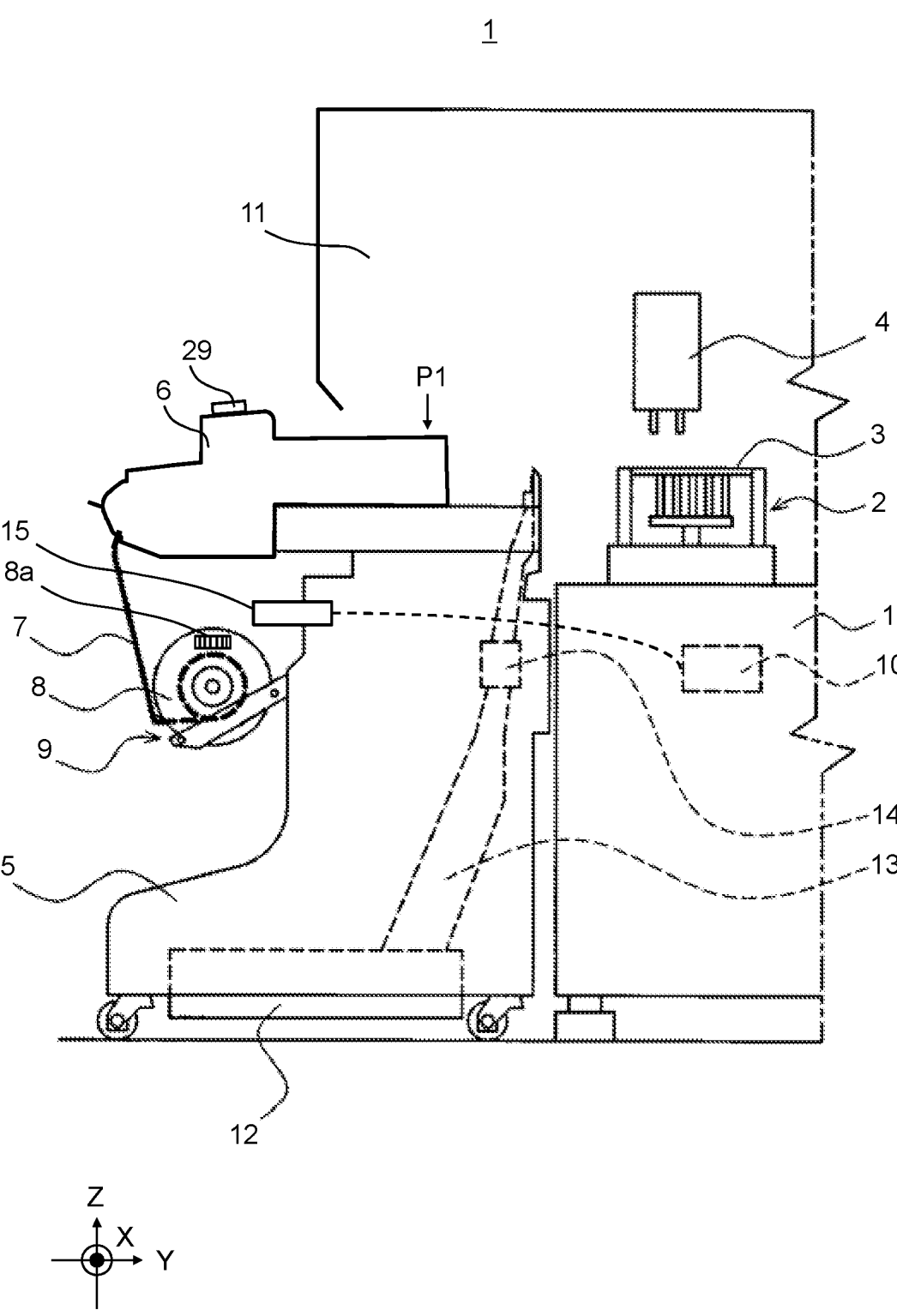
FIG. 1 is a schematic view of a component supply apparatus of one embodiment of the present disclosure.

The configuration of the component attaching apparatus 1 of the embodiment of the present disclosure will be described with reference to FIG. 1. FIG. 1 shows an X-direction that is a substrate conveying direction (the direction perpendicular to the paper surface in FIG. 1) and a Y-direction that intersects the substrate conveying direction at a right angle (the right-and-left direction in FIG. 1) as the directions of two axes intersecting each other at a right angle in a horizontal plane. FIG. 1 also shows a Z-direction (the up-and-down direction in FIG. 1) as the height direction that intersects the horizontal plane at a right angle.

The configuration of the component attaching apparatus 1 will be described with reference to FIG. 1. The component attaching apparatus 1 manufactures a mounting substrate that is a substrate having components mounted thereon. A substrate conveying mechanism 2 disposed on an upper face of a base stand la conveys a substrate 3 in the X-direction, and positions and holds the substrate 3. Above the substrate conveying mechanism 2, an attaching head 4 is disposed that is moved in a horizontal direction (the X-direction, the Y-direction) by a head moving mechanism not shown. Plural tape feeders 6 are lined in the X-direction to be attached to the upper portion of a wheeled platform 5 that is coupled with the base stand la being lateral to the substrate conveying mechanism 2.

On the front side of the wheeled platform 5 and under the tape feeders 6, a reel holding part 9 is disposed supporting a reel 8 to be rotatable that has a carrier tape 7 storing therein the components to be supplied to the component attaching apparatus 1. wound thereon. The tape feeders 6 each convey the carrier tape 7 stored in the reel 8 in a tape feed direction to supply the components to a position P1 for taking out components by the attaching head 4. An identifier 8a that identifies the components stored in the carrier tape 7 is pasted on the reel 8. The identifier 8a is, for example, a two-dimensional bar code or an RFID tag.

The component attaching apparatus 1 includes an attachment controller 10 that controls the substrate conveying mechanism 2, the attaching head 4, and the head moving mechanism. The attachment controller 10 transmits a supply order for the components to the tape feeder 6 and thereby controls the attaching head 4 and the head moving mechanism to execute a component attachment work for the attaching head 4 to take out the component supplied by the tape feeder 6 to the component taking out position to transport the component to and mount the component at an attachment point of the substrate 3 held by the substrate conveying mechanism 2. As above, the tape feeder 6 is a component supply apparatus that supplies the components stored in the carrier tape 7 to the component attaching apparatus 1. The components stored in the carrier tape 7 are, for example, chip-type electronic components. Above the wheeled platform 5, a main body cover is disposed that can freely be opened and closed and that covers moveable mechanisms such that the worker avoids touching any movable mechanism such as the attaching head 4 during the work thereof.

The component attaching apparatus 1 further includes a reader 15 that reads information of the identifier 8a. The reader device 15 is, for example, a two-dimensional bar code reader or an RFID reader. The information of the identifier 8a read by the reader device 15 is sent to the attachment controller 10. The attachment controller 10 includes a collator 10a and a storage 10b. The attachment controller 10 includes, for example, a computing device such as a processor or an FPGA, a memory or an SSD, and the like.

The storage 10b stores therein information on the components to be replenished into the tape feeder 6. The collator 10a compares the information of the identifier 8a read by the reader device 15 and the information on the components to be replenished, that is stored in the storage 10b, with each other. When the collator 10a determines that the information of the identifier 8a and the information on the components to be replenished match with each other, the collator 10a transmits a signal indicating the match, as a comparison result, to a feeder controller 28. When the collator 10a determines that the information of the identifier 8a and the information on the components to be replenished do not match with each other, the collator 10a transmits a signal indicating the non-match, as a comparison result, to the feeder controller 28.

In FIG. 1, in the lower portion of the wheeled platform 5, a collection box 12 is disposed that collects the carrier tape 7 that has the components taken out therefrom by the attaching head 4 and that is empty and discharged from the backward of the tape feeder 6. On the backward side of the wheeled platform 5, a discharge chute 13 is disposed that guides the empty carrier tape 7 discharged from the tape feeder 6, to the collection box 12. In the discharge chute 13, a cutting part 14 is disposed that cuts the empty carrier tape 7 at a predetermined length thereof. The empty carrier tape 7 discharged from the tape feeder 6 is cut off by the cutting part 14 to be collected in the collection box 12.

<<Tape Feeder>>

Figure 2:
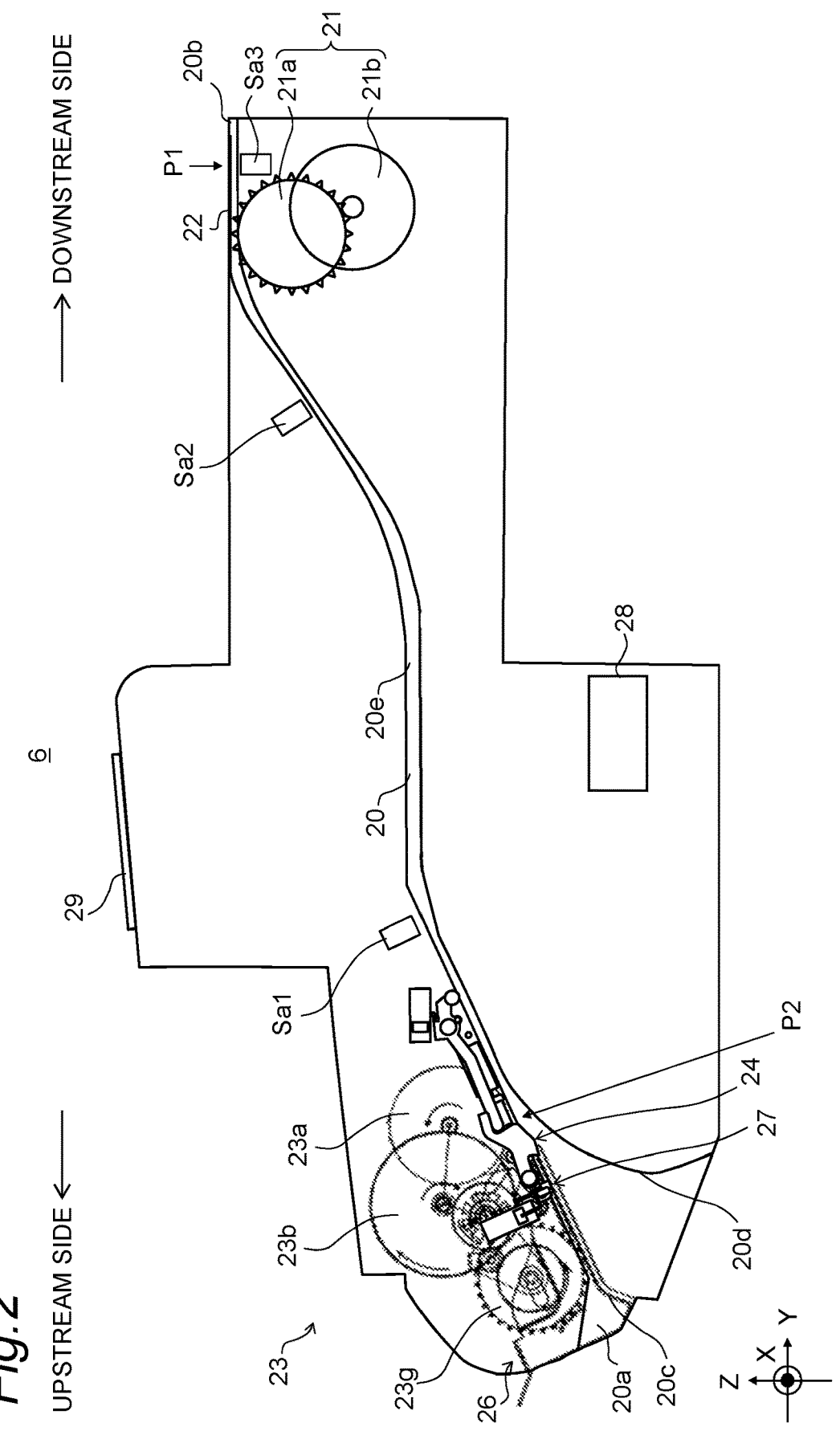
FIG. 2 is a schematic view of the component supply apparatus of one embodiment of the present disclosure.
Figure 3:
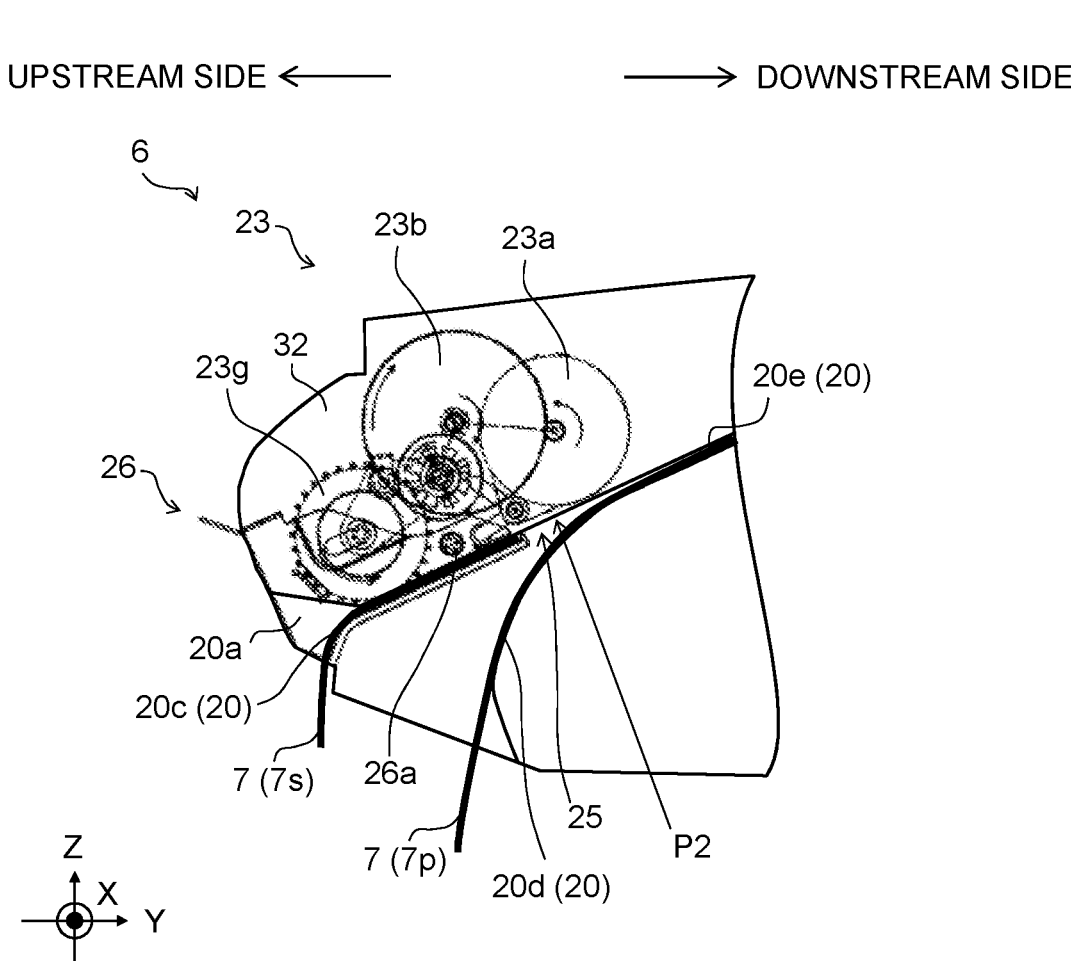
FIG. 3 is a partial enlarged view of the component supply apparatus.

The configuration of the tape feeder 6 will next be described with reference to FIG. 2 and FIG. 3. FIG. 2 is a schematic view of the tape feeder 6 of the embodiment. FIG. 3 is a partial enlarged view of the tape feeder 6.

The tape feeder 6 includes a tape conveying path 20, a first tape conveying part 21, a second tape conveying part 23, a tape holding part 26, and a tape holding releasing mechanism 34. The tape feeder 6 further includes an insertion inlet 20a through which the carrier tape 7 is input into the tape conveying path 20, and a discharge outlet 20b through which the carrier tape 7 is discharged from the tape conveying path 20.

The tape conveying path 20 guides the carrier tape 7 that is pulled out from the reel 8 and that is inserted from the insertion inlet 20a into the tape feeder 6, to the component taking out position P1 inside the tape feeder 6 and furthermore leads the carrier tape 7 to the discharge outlet 20b.

The insertion inlet 20a is opened on the upstream side in a tape feeding direction in the tape feeder 6 (on the left side of FIG. 2). The discharge outlet 20b is opened on the downstream side in the tape feeding direction (on the right side of FIG. 2). The tape conveying path 20 communicates from the insertion inlet 20a to the discharge outlet 20b. The attaching head 4 takes out the components at the component taking out position P1 that is disposed in the middle of the tape conveying path 20.

In the course of continuous execution of the component attachment work, plural carrier tapes 7 for which the carrier tape 7 stored in each one real 8 is handled as a unit lot, are sequentially inserted from the insertion inlet 20a to be supplied to the tape feeder 6. Of the two carrier tapes 7 that are introduced from the insertion inlet 20a to be fed through the tape conveying path 20, hereinafter, as necessary, the carrier tape 7 precedingly fed will be referred to as "primary tape 7*p*" and the carrier tape 7 fed next to the primary tape 7*p* will be referred to as "secondary tape 7*s*" to make the description (see FIG. 3). The tape conveying path 20 includes a first conveying route 20*c* into which the carrier tape 7 is inserted on the upstream side, a second conveying route 20*d* that is positioned under the first conveying route 20*c*, and a third conveying route 20*e* that extends from a position P2 for the second conveying route 20*d* and the first conveying route 20*c* to join together, to the discharge outlet 20*b*.

The first tape conveying part 21 conveys the carrier tape 7 to the component taking out position P1 on the downstream side in the tape conveying path 20. The first tape conveying part 21 includes a first sprocket 21*a* that engages with the carrier tape 7, and a first motor 21*b* that drives the first sprocket 21*a* to rotate. Above the first tape conveying part 21, a tape cover 22 is attached that presses the carrier tape 7 from above and that includes a peeling blade to expose the components stored in the carrier tape 7. An opening is formed at the position corresponding to the component taking out position P1, of the tape cover 22. When the carrier tape 7 is caused to travel along the lower face of the tape cover 22 by the first sprocket 21*a*, the components are exposed by the peeling blade and the exposed components are conveyed to the opening formed in the downstream thereof, that is, the component taking out position P1. The method of exposing the components stored in the carrier tape 7 may be a method according to which a pair of rollers not shown are disposed downstream the component taking out position P1 of the tape conveying path 20 and a top tape sealing the components in the carrier tape 7 is peeled off by the rollers. In the case of an overall peeing method, no peeling blade may be disposed in the tape cover 22.

The second tape conveying part 23 feeds the carrier tape 7 inserted from the insertion inlet 20*a* into the first conveying route 20*c*, to the first tape conveying part 21. The second tape conveying part 23 is disposed on the upstream side in the tape conveying path 20. The second tape conveying part 23 includes, for example, a second motor 23*a*, a first gear 23*b*, a second gear 23*c*, a third gear 23*d*, a fourth gear 23*e*, a fifth gear 23*f*, and a second sprocket 23*g*.

An output gear 23*aa* of the second motor 23*a* engages with the first gear 23*b*. The second gear 23*c* is disposed to be rotatable concentrically with the first gear 23*b* and engages with the third gear 23*d*. The third gear 23*d* engages with the fourth gear 23*e*, and the fourth gear 23*e* engages with the fifth gear 23*f*. The fifth gear 23*f* is fixed rotatably on the second sprocket 23*g* that engages with the carrier tape 7. The rotation driving power of the second motor 23*a* is transmitted to the second sprocket 23*g* through the first gear 23*b* to the fifth gear 23*f*.

The tape conveying path 20, on the upstream side thereof, includes the first conveying route 20*c* and the second conveying route 20*d*. The first conveying route 20*c* and the second conveying route 20*d* join together at the position P2. The carrier tape 7 to be supplied to the tape feeder 6 is first conveyed by the second tape conveying part 23 along the first conveying route 20*c* to the downstream side of the tape conveying path 20. When the carrier tape 7 is thereafter conveyed to the first tape conveying part 21, the carrier tape 7 is moved from the first conveying route 20*c* to the second conveying route 20*d* as the preceding primary tape 7*p*. The primary tape 7*p* is thereby conveyed from the second conveying route 20*d* to the downstream of the tape conveying path 20 through the third conveying route 20*e*, and the next secondary tape 7*s* can therefore be inserted into the first conveying route 20*c*.

The tape feeder 6 includes a tape stopper part 24, a shutter unit 27, and a lock part 45 that are each disposed in the lower portion of the second tape conveying part 23. The tape feeder 6 also includes a first sensor Sa1, a second sensor Sa2, and a third sensor Sa3.

The first sensor Sa1 detects that the carrier tape 7 inserted into the tape feeder 6 reaches a position determined in advance of the third conveying route 20*e*, that is present more downstream than the position P2 at which the second conveying route 20*d* and the first conveying route 20*c* join together.

The second sensor Sa2 detects that the carrier tape 7 traveling in the tape conveying path 20 reaches a point just before the component taking out position P1. The second sensor Sa2 is therefore disposed more downstream in the tape conveying path than the first sensor Sa1 is, and more upstream in the tape conveying path 20 than the third sensor Sa3 is.

The third sensor Sa3 detects that the carrier tape 7 traveling in the tape conveying path 20 reaches the component taking out position P1. The third sensor Sa3 is disposed, for example, more downstream than the second sensor Sa2 and the first sprocket 21*a* of the first tape conveying part are. The first sensor Sa1 to the third sensor Sa3 are each an optical sensor that detects presence or absence of the carrier tape 7, and are each, for example, a color sensor or a photosensor.

Figure 4:
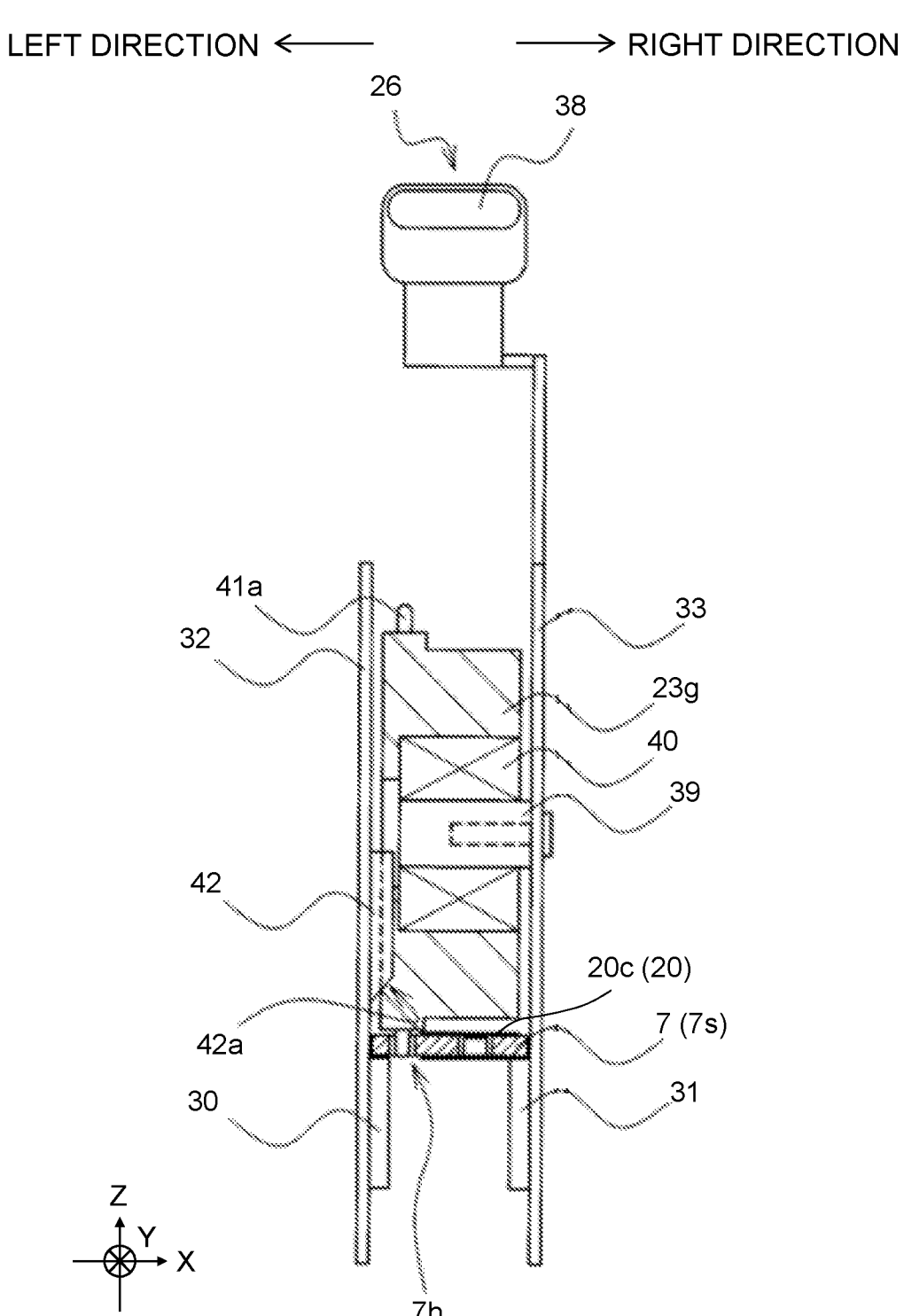
FIG. 4 is a partial cross-sectional view of the component supply apparatus.

The tape holding part 26 supports the carrier tape 7 in at least one portion of the first conveying route 20*c*, and maintains the attitude of the carrier tape 7 for being conveyed. Reference is made to FIG. 4. The tape holding part 26 includes a first support part 30, a second support part 31, a plate-like member 32, and a moveable member 33. Hereinafter, for convenience, as shown in FIG. 4, facing the downstream direction in which the carrier tape 7 is conveyed in the tape feeder 6, one direction is referred to as "left direction" and the other direction is referred to as "right direction".

The first support part 30 supports one side portion in the width direction, of the carrier tape 7 from beneath. The first support part 30 is formed on the right side face of the plate-like member 32. The second support part 31 support the other side face of the carrier tape 7 from beneath.

The plate-like member 32 extends in the up-and-down direction (the Z-direction) against the tape feeding direction. An inner side face (the right side face) of the plate-like member 32 is a guiding face that guides the left side face of the carrier tape 7. The plate-like member 32 is fixed on a side wall of the tape feeder 6.

The movable member 33 has a plate-like shape and is connected to be swingable in the up-and-down direction centering a rotating shaft 26*a*. An inner side face of the movable member 33 is a guiding face that guides the right side face of the carrier tape 7.

In the upper portion of the movable member 33, a hand grip 38 is formed that includes a lever for the worker to operate using the worker's fingers. The upstream side of the movable member 33 can be lifted upward by lifting upward the hand grip 38 by the worker (see FIG. 9). In this manner, the movable member 33 is displaceable in the up-and-down direction against the fixed plate-like member 32 (see FIG. 11).

In FIG. 4, the movable member 33 has a rotating shaft 39 attached thereto that has its rotation center parallel to the width direction of the carrier tape 7. The rotating shaft 39 has the second sprocket 23g rotatably attached thereto through a one-way clutch 40. Plural pins 41a are disposed at left-leaning positions of the outer circumferential face (that is, the side close to the plate-like member 32) of the second sprocket 23g. The pins 41a of the second sprocket 23g engage with feed holes 7h formed in the carrier tape 7 whose lower face is supported by the first support part 30 and the second support part 31, in the state where the movable member 33 is present at the initial position thereof.

The first support part 30 supports a side portion on the side having the feed holes 7h formed thereon, of the carrier tape 7, from beneath. The second sprocket 23g attached to the horizontal rotating shaft 39 through the one-way clutch 40 constitutes an latching part that engages with the feed holes 7h of the carrier tape 7 to latch the carrier tape 7 to the first support part 30.

The one-way clutch 40 allows a rotation of the second sprocket 23g when the carrier tape 7 engaging with the second sprocket 23g moves to the direction of the insertion inlet 20a on the tape holding part 26, but does not allow any rotation in the reverse direction thereof. The carrier tape 7 can thereby be prevented from dropping from the tape feeder 6. As above, the movable member 33 has the second sprocket 23g attached thereto that is attached, through the one-way clutch 40, to the rotating shaft 39 whose rotation axis is the horizontal direction.

At a position distant above the first support part 30, of the inner side face of the plate-like member 32, a protrusion 42 is formed that protrudes inward from the plate-like member 32. On the lower end of the protrusion 42, a taper 42a is formed that includes a slope approaching the inner side face of the plate-like member 32 toward a downward direction (a slope getting distant from the right side face of the plate-like member 32 toward an upward direction). The lower end of the protrusion 42 therefore has the width in the horizontal direction at a point therein, that becomes narrower as the point moves downward.

Figure 5:
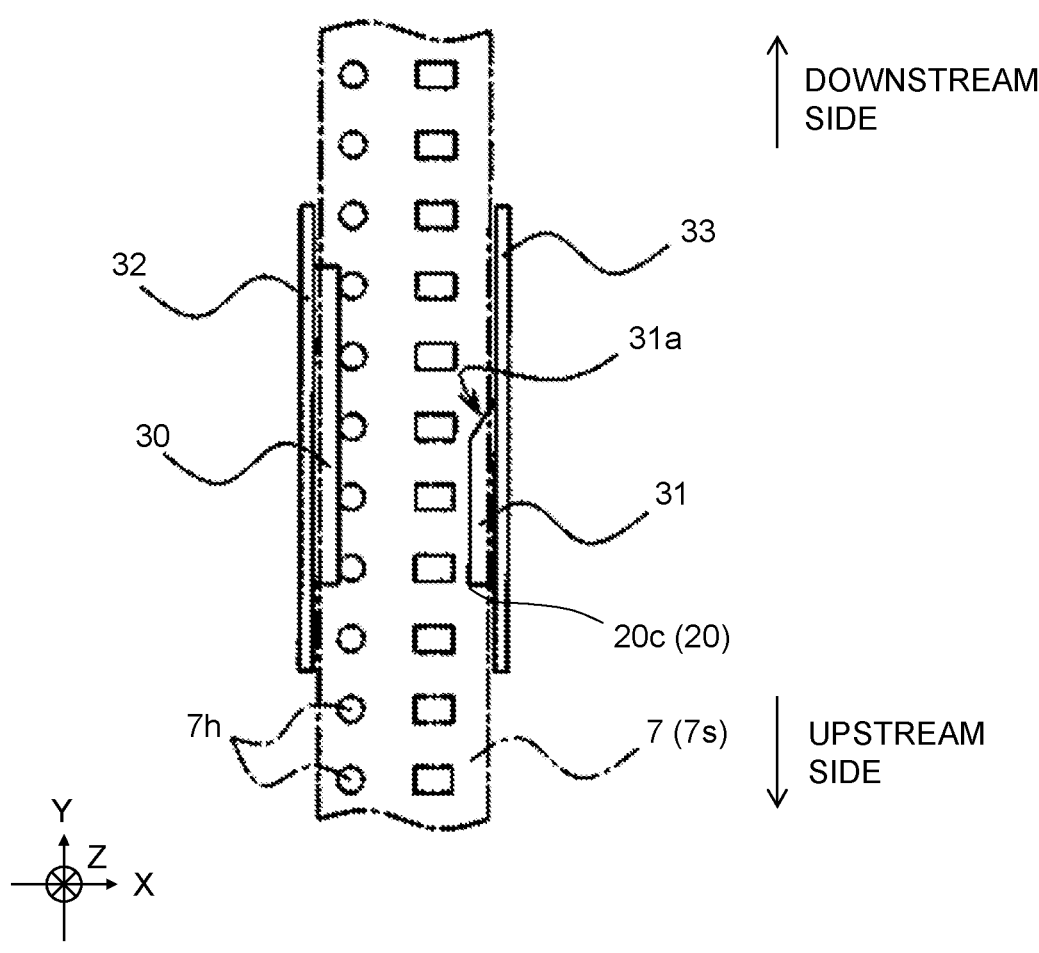
FIG. 5 is a lower face diagram of a tape holding part of the component supply apparatus.

In FIG. 5, the position of the end on the downstream side of the second support part 31 is present more upstream than the position of the end on the downstream side of the first support part 30 is. On the downstream side of the second support part 31, a cutout portion 31a is formed that includes a slope whose side face at a point approaches the inner side face of the movable member 33 as the point moves toward the downstream side. One end on the side of the insertion inlet 20a (the downstream side) of the second support part 31 has the width thereof at a point in the horizontal direction, that becomes narrower as the point moves toward the side of the insertion inlet 20a.

The configuration of the tape holding releasing mechanism 34 will be described with reference to FIG. 6 to FIG. 10. FIG. 6 to FIG. 10 are side views showing the configurations of the second tape conveying part 23 and the tape holding releasing mechanism 34 of the tape feeder 6.

The tape holding releasing mechanism 34 causes the carrier tape 7 that is present in the first conveying route 20c and that is held by the tape holding part 26, to drop onto the second conveying route 20d. The tape holding releasing mechanism 34 operates by using the motivity of the second motor 23a of the second tape conveying part 23. The tape holding releasing mechanism 34 includes a ratchet mechanism 35 that is rotated by the driving force of the second motor 23a, and a lever 36 that is swung by the ratchet mechanism 35.

The ratchet mechanism 35 includes a ratchet gear 35a and ratchet pawls 35b. The ratchet hear 35a is rotatably attached to the third gear 23d concentrically with the third gear 23d. The ratchet gear 35a rotates together with the ratchet hear 35a.

The lever 36 has, for example, an L-like shape, has ratchet pawls 35b formed on one end thereof, and is connected to an end on the downstream side of the movable member 33 of the tape holding part 26, on the other end thereof. The lever 36 has a rotating shaft 36a disposed in the central portion thereof, and the lever 36 is attached to the tape feeder 6 through the second motor 23a to be swingable around the rotating shaft 36a.

Figure 6:
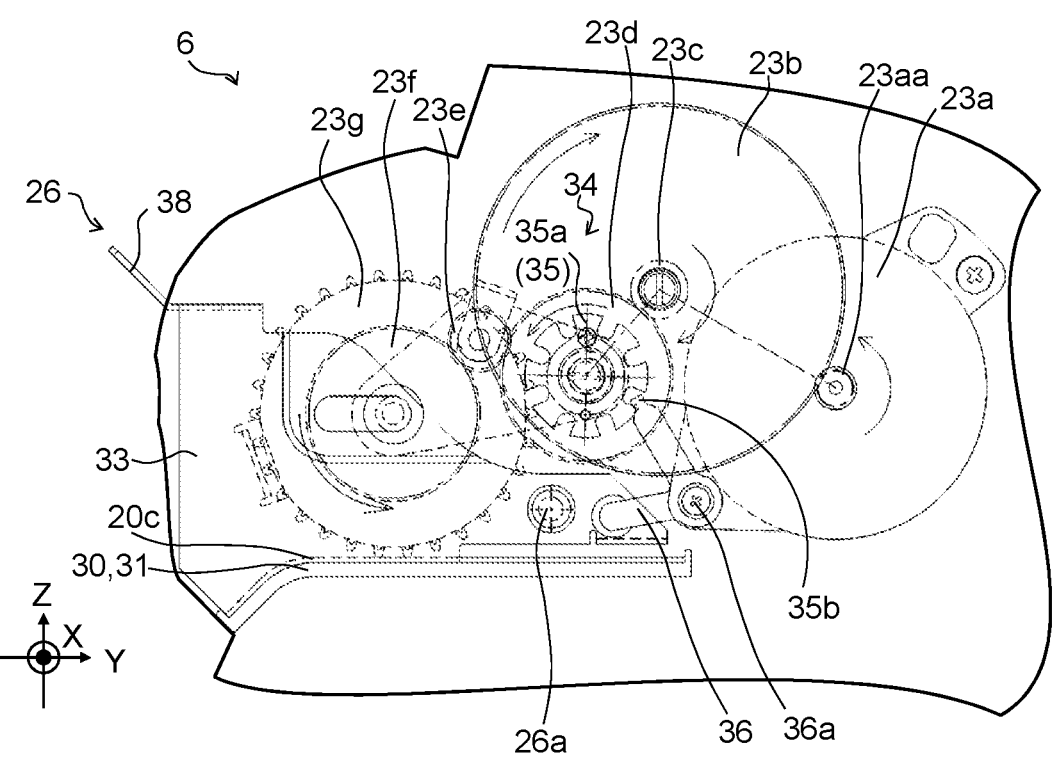
FIG. 6 is a side view showing the configurations of a second tape conveying part and a tape holding releasing mechanism of the component supply apparatus.
Figure 7:
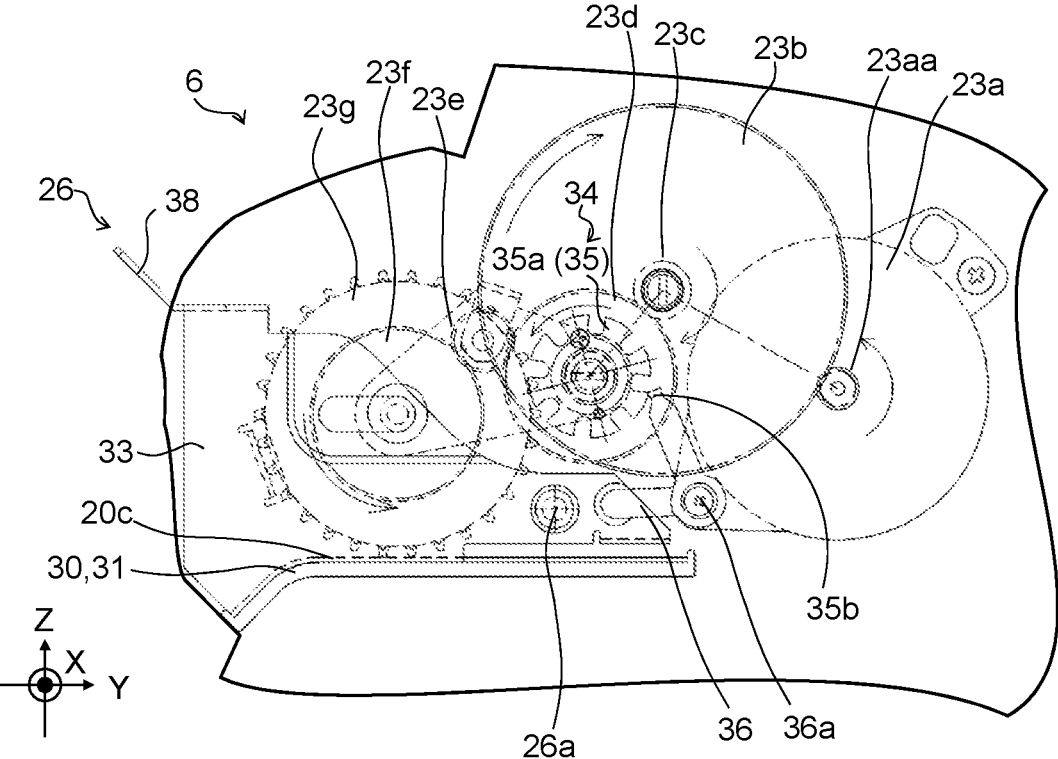
FIG. 7 is a side view showing the configurations of the second tape conveying part and the tape holding releasing mechanism of the component supply apparatus.

As shown in FIG. 6 and FIG. 7, in the case where the second motor 23a rotates forward, the second motor 23a and the ratchet gear 35a rotate counterclockwise. In this case, the ratchet gear 35a acts to lift up the ratchet pawls 35b of the lever 36, and the ratchet pawls 35b therefore continues useless rotation without engaging with the ratchet gear 35a.

Figure 8:
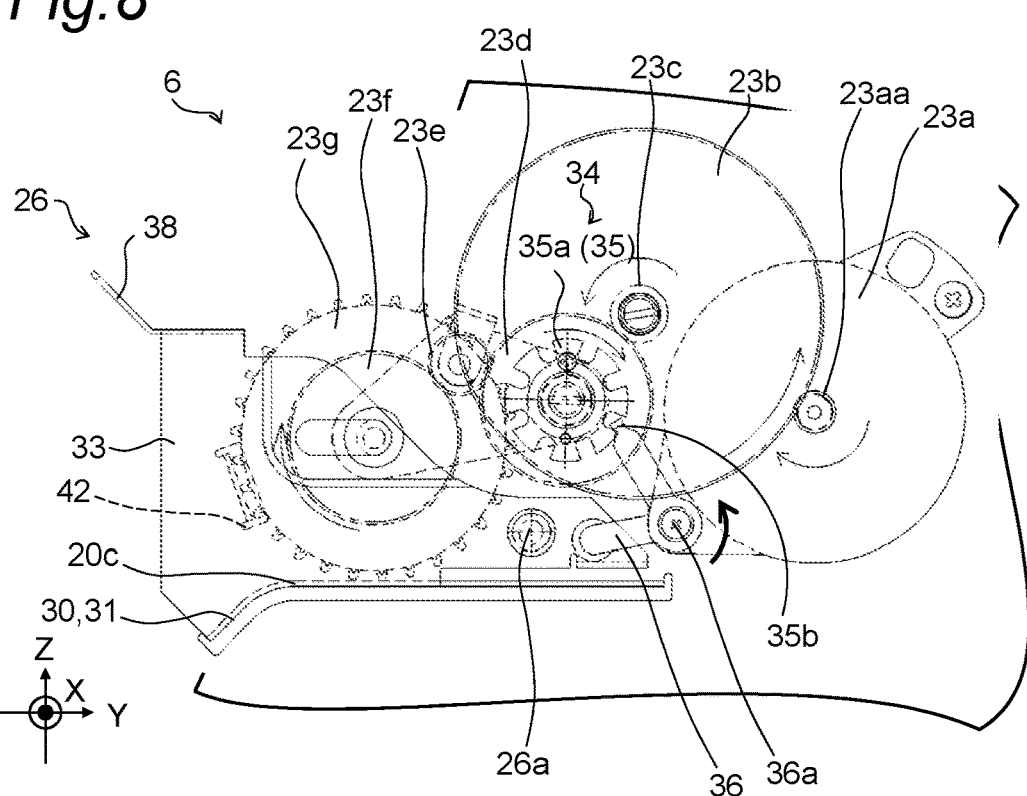
FIG. 8 is a side view showing the configurations of the second tape conveying part and the tape holding releasing mechanism of the component supply apparatus.

As shown in FIG. 8, in the case where the second motor 23a rotates backward, the second motor 23a and the ratchet gear 35a rotate clockwise. In this case, the ratchet gear 35a acts to push down the ratchet pawls 35b of the lever 36, the ratchet pawls 35b therefore engage with the ratchet gear 35a, and the lever 36 starts rotating counterclockwise.

Figure 9:
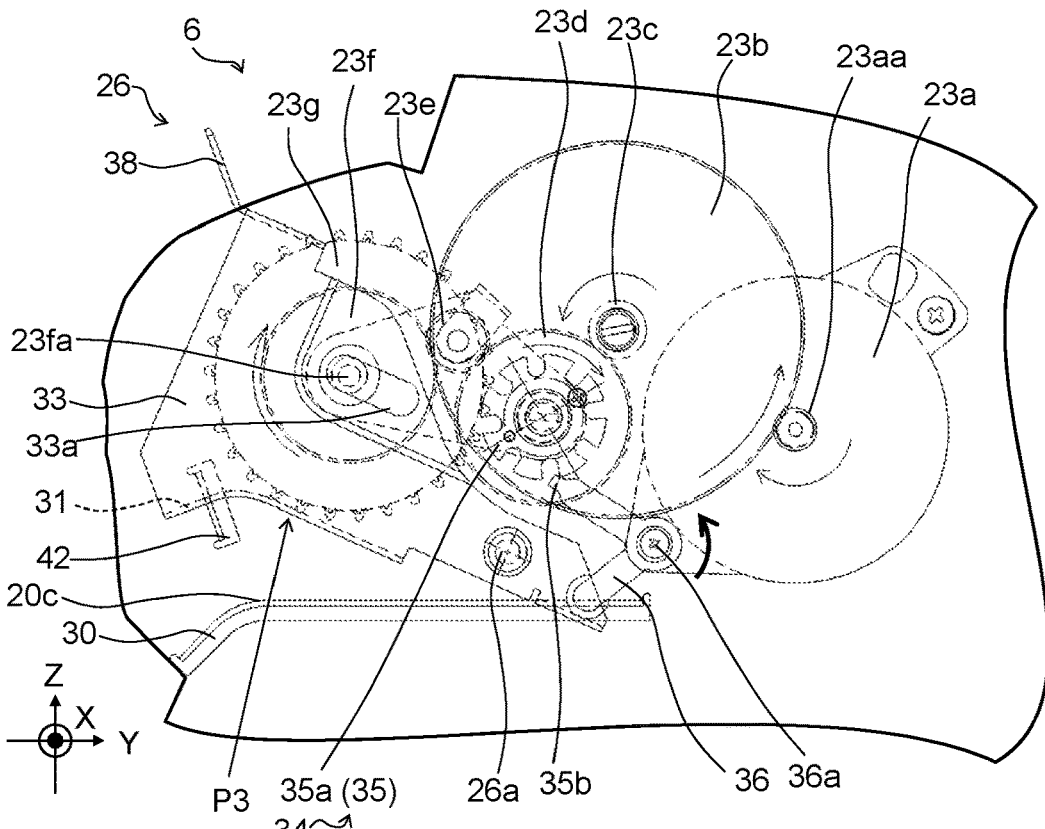
FIG. 9 is a side view showing the configurations of the second tape conveying part and the tape holding releasing mechanism of the component supply apparatus.

As shown in FIG. 9, when the second motor 23a further rotates backward, the ratchet gear 35a pushes down the ratchet pawls 35b of the lever 36 and the lever 36 therefore rotates counterclockwise. The lever 36 thereby pushes downward an end on the downstream side of the movable member 33 of the tape holding part 26. As a result, the movable member 33 rotates clockwise centering the rotating shaft 26a and the second support part 31 moves to a release position P3 that is present thereabove.

Figure 10:
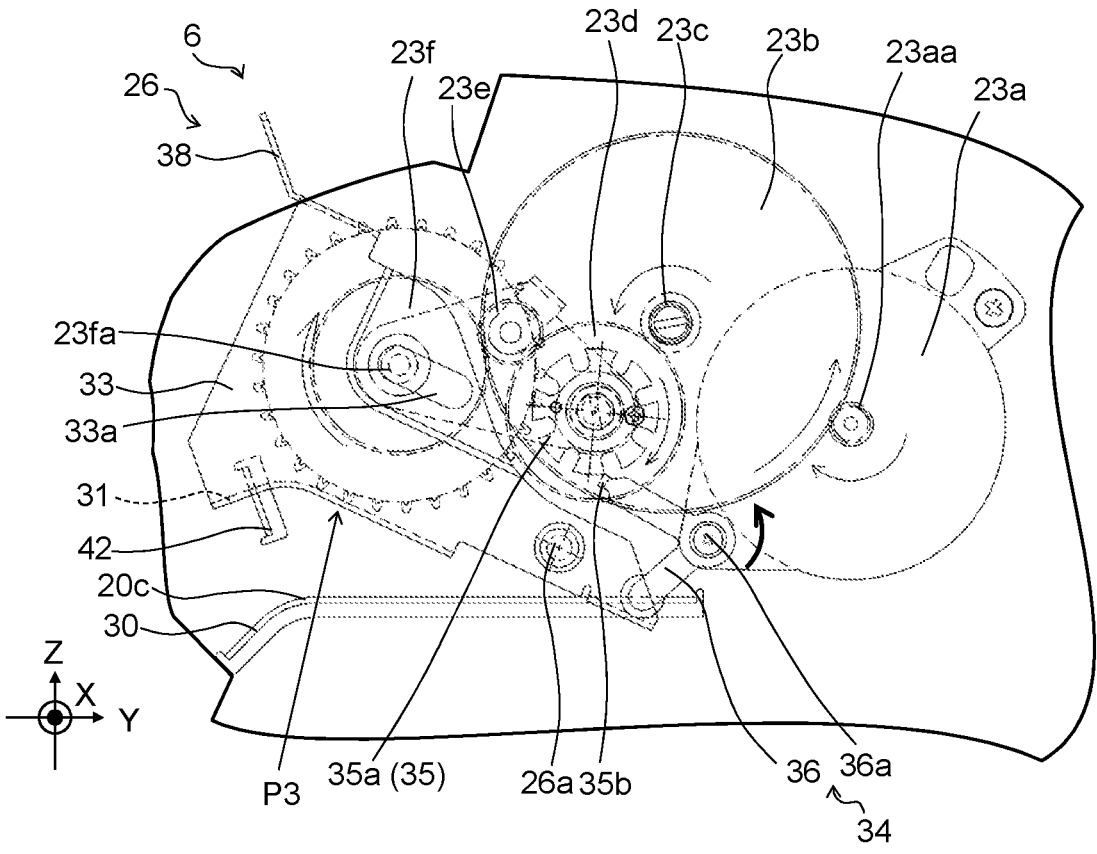
FIG. 10 is a side view showing the configurations of the second tape conveying part and the tape holding releasing mechanism of the component supply apparatus.

As shown in FIG. 10, when the second motor 23a further continues to rotate backward, the ratchet gear 35a continues to act to push down the ratchet pawls 35b of the lever 36 and the ratchet pawls 35b of the lever 36 do not therefore engage with the ratchet gear 35a. The state is therefore maintained where the lever 36 pushes downward the end on the downstream side of the movable member 33 of the tape holding part 26, and the state continues where the second support part 31 of the tape holding part 26 is positioned at the release position P3 present thereabove.

When the second motor 23a next rotates forward, the ratchet gear 35a acts to lift up the ratchet pawls 35b of the lever 36, the ratchet gear 35a therefore engages with the ratchet pawls 35b of the lever 36, and the lever rotates clockwise. The lever 36 thereby lifts upward the end on the downstream side of the movable member 33 of the tape holding part 26 and the second support part 31 returns to the tape holding position that is the original position thereof.

A function of releasing the carrier tape 7 that is present in the first conveying route 20c, from the tape holding part 26 will next be described with reference to FIG. 11. As shown in FIG. 11(a), in the state where the movable member 33 is positioned at the initial position thereof and the second support part 31 is present at the position at the equal height to that of the first support part 30, the carrier tape 7 is held by the tape holding part 26. When the carrier tape 7 present in the first conveying route 20c is released from the tape holding part 26, the feeder controller 28 causes the second motor 23a of the second tape conveying part 23 to rotate backward. The movable member 33 thereby ascends integrally together with the second support part 31 and the second sprocket 23g. The movable member 33 also ascends when the worker manually holds and lifts upward the hand grip 38.

Figure 11:
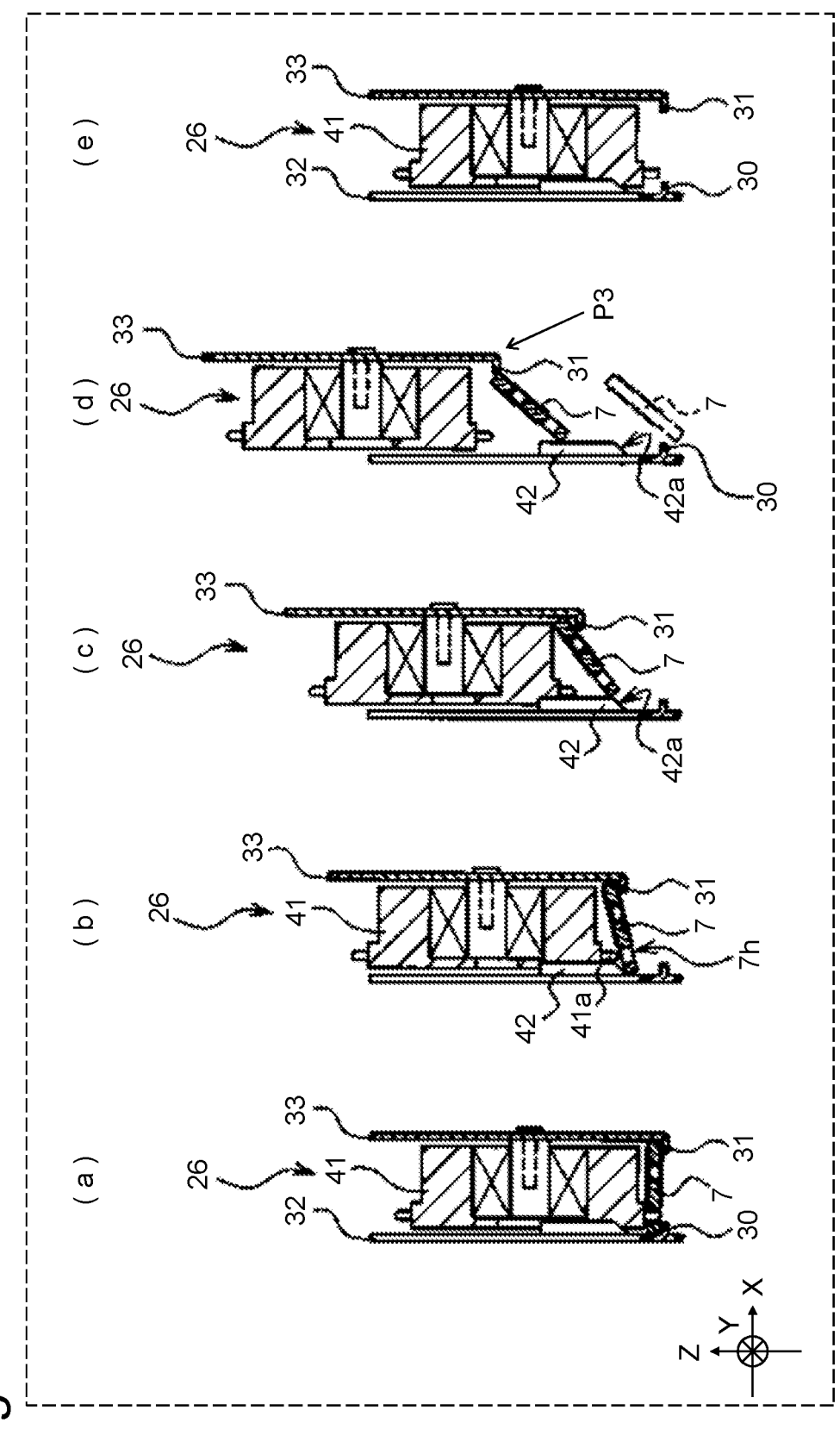
FIG. 11 is an explanatory view explaining release of a carrier tape, (a) showing the state where the carrier tape is held, (b) and (c) showing the state where a movable member is displaced upward, (d) showing the state where the carrier tape is dropped by the displacement of the movable member, (e) showing the state where the movable member returns to the original position thereof.
Figure 12:
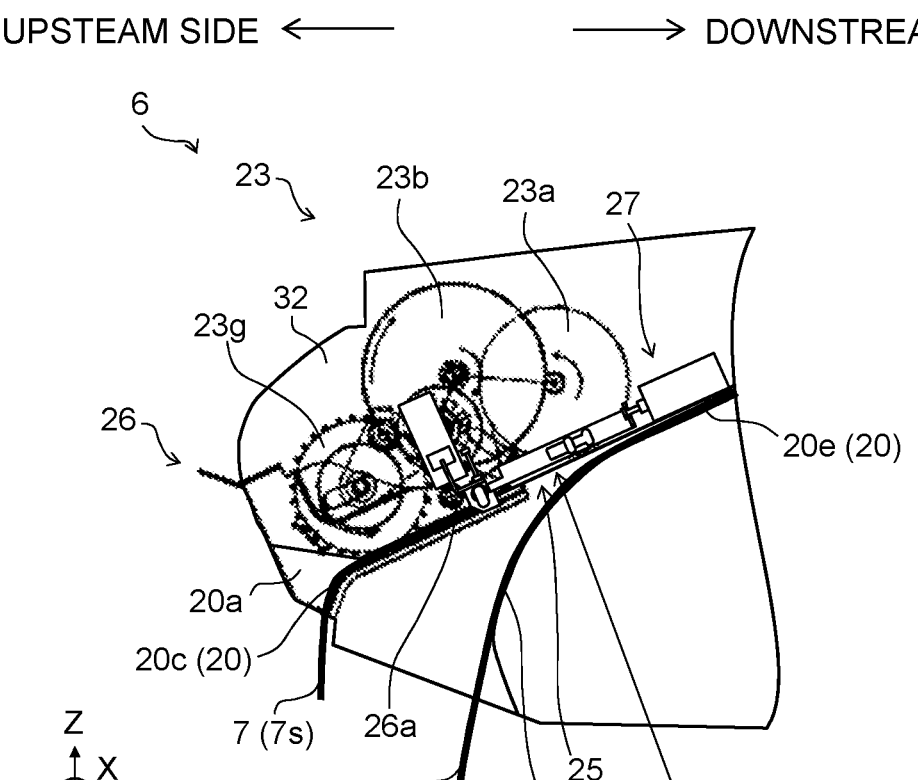
FIG. 12 is a partial enlarged view of the vicinity of a shutter of the component supply apparatus.
Figure 13:
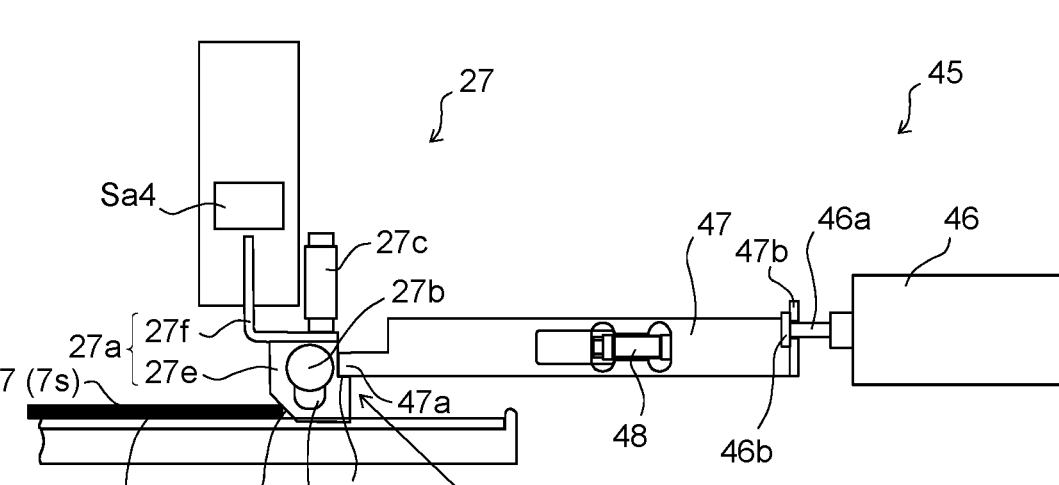
FIG. 13 is a side view showing the configurations of the shutter and a lock part of the component supply apparatus.

As shown in FIG. 11(*b*), the carrier tape 7 whose lower face in the right side portion thereof is supported by the second support part 31 moves upward as the movable member 33 ascends, and the upper face in the left side portion of the carrier tape 7 abuts the protrusion 42. When the movable member 33 further ascends, the pins 41*a* of the second sprocket 23*g* are detached from the feed holes 7*h* of the carrier tape 7. As shown in FIG. 11(*c*), when the carrier tape 7 ascends together with the movable member 33, the carrier tape 7 is pushed by the taper 42*a* of the protrusion 42 to kink counterclockwise being displaced to a position (on the right side) at which the carrier tape 7 does not overlap on the first support part 30.

As shown in FIG. 11(*d*), when the movable member 33 further ascends, the kinking of the carrier tape 7 is increased and the right end of the carrier tape 7 thereafter becomes out of alignment with the second support part 31 for the carrier tape 7 to drop therefrom. At this time, the right end of the carrier tape 7 reliably becomes out of the alignment and drops with the cutout portion 31*a* on the downstream side of the second support part 31 as the starting point. The left end of the carrier tape 7 is already displaced to the right side by the protrusion 42 and the carrier tape 7 therefore drops downward without being hooked by the first support part 30 (indicated in FIG. 11(*d*) by a dotted line).

The carrier tape 7 discharged from the tape holding part 26 moves as the primary tape 7*p* to the second conveying route 20*d* formed under the first conveying route 20*c* (see FIG. 3). The release of the carrier tape 7 from the tape holding part 26 is executed, for example, before the time when the carrier tape 7 is inserted into the tape feeder 6 and the components are taken out at the component taking out position P1. When the carrier tape 7 (the primary tape 7*p*) is released from the tape holding part 26, the next carrier tape 7 (the secondary tape 7*s*) can be inserted into the tape holding part 26 any time.

<<Shutter Unit>>

The shutter unit 27 will next be described with reference to FIG. 14 and Fig. FIG. 14 is a partial enlarged view of the vicinity of the shutter unit. FIG. 15 is a side view showing the configurations of the shutter unit 27 and the lock part 45.

The shutter unit 27 prevents the carrier tape 7 from traveling until the comparison of the components in the carrier tape 7 inserted into the first conveying route 20*c*. The shutter unit 27 includes a shutter 27*a*, a pin 27*b*, a coil spring 27*c*, and a fourth sensor Sa4.

The shutter 27*a* abuts the carrier tape 7 to stop the traveling of the carrier tape 7. The shutter 27*a* includes a shutter main body 27*e* and a plate-like member 27*f*.

The shutter main body 27*e* includes an inclined part 27*ea* for the carrier tape 7 to abut, an elongated hole 27*eb* that is elongated in the up-and-down direction, and a step portion 27*ec* that is fitted with the lock part 45. The pin 27*b* is inserted into the elongated hole 27*eb* and the shutter 27*a* is displaceable in the up-and-down direction along the elongated hole 27*eb*.

The plate-like member 27*f* extends upward from the shutter main body 27*e*. The fourth sensor Sa4 detect whether the shutter 27*a* is positioned at a tape stop position P4 at which the shutter 27*a* stops the traveling of the carrier tape 7 or the shutter 27*a* is positioned at a retreat position P5 above the tape stop position P4. The fourth sensor Sa4 is, for example, an optical sensor. In the state where the shutter 27*a* is present at the tape stop position P4, the shutter 27*a* is lowered to the first conveying route 20*c* and the fourth sensor Sa4 cannot therefore detect the plate-like member 27*f*. In the state where the shutter 27*a* is present at the retreat position P5, the shutter 27*a* is lifted upward from the first conveying route 20*c* and the fourth sensor Sa4 therefore detects the plate-like member 27*f*.

The coil spring 27*c* biases the shutter main body 27*e* such that the coil spring 27*c* pushes downward the shutter 27*a*, that is, the lower end of the shutter main body 27*e* contacts the first conveying route 20*c*. When the carrier tape 7 is conveyed to the downstream side by the second tape conveying part 23, the carrier tape 7 counteracts the spring force of the coil spring 27*c* to lift up the shutter 27*a* to travel.

Following the control by the feeder controller 28, the lock part 45 locks the displacement of the shutter 27*a*. The lock part 45 includes a solenoid 46, a lever 47, and a coil spring 48.

The solenoid 46 attracts the lever 47 that prevents the displacement of the shutter 27*a*, to the downstream side to enable the shutter 27*a* to be displaced from the retreat position P5 to the tape stop position P4. The solenoid 46 includes a plunger 46*a* and a plate member 46*b* that has a circular shape and that is fixed on the tip of the plunger 46*a*. The plate member 46*b* of the solenoid 46 engages with an end 47*b* on the downstream side of the lever 47. When the solenoid 46 receives an instruction for the attraction, from the feeder controller 28, the solenoid 46 displaces the plunger 46*a* to an attraction position to displace the lever 47 to the downstream side. When the instruction for the attraction from the feeder controller 28 ceases, the solenoid 46 displaces the plunger 46*a* to the original release position thereof.

The lever 47 is biased by the coil spring 48 toward the upstream side, that is, to the side of the shutter 27*a*. An end 47*a* on the upstream side of the lever 47 is fitted with the step portion 27*ec* of the shutter main body 27*e* in the case where the plunger 46*a* of the solenoid 46 is released. The shutter 27*a* is thereby prevented from ascending to the retreat position P5 to lock the move of the shutter 27*a*.

In the case where the components match with the components to be supplied as a result of the comparison of the components by the attachment controller 10, the feeder controller 28 transmits an instruction for the attraction, to the solenoid 46. As shown in FIG. 14, the solenoid 46 thereby attracts the plunger 46*a* to displace the lever 47 to the downstream side. As a result, the end 47*a* on the upstream side of the lever 47 becomes out of the step portion 27*ec* of the shutter main body 27*e* and the lock of the shutter 27*a* is released.

Even when the lock of the shutter 27*a* is released, the shutter 27*a* is biased downward by the coil spring 27*c*, while the feeder controller 28 transmits an instruction for tape conveyance to the second tape conveying part 23 after ceasing the instruction for the attraction, to the solenoid 46, and the carrier tape 7 is therefore conveyed to the downstream side. The tip of the carrier tape 7 thereby counteracts the spring force of the coil spring 27*c* to push up the inclined part of the shutter main body 27*e*.

When the shutter main body 27*e* is pushed upward by the tip of the carrier tape 7, the plate-like member 27*f* of the shutter 27*a* is also displaced upward and the fourth sensor Sa4 detects the plate-like member 27*f*. The fact can thereby be detected, that the carrier tape 7 passes under the shutter 27*a*, that is, the carrier tape 7 is conveyed from the first conveying route 20*c* toward the third conveying route 20*e*.

In the case where the components do not match with the components to be supplied as a result of the comparison of the components by the attachment controller 10, the feeder controller 28 informs the worker from, for example, an operation display panel 29 of the fact that the reel 8 that is set is wrong. When the worker recognizes that the reel 8 is wrong, the worker lifts up the hand grip 38 of the tape holding part 26 to remove the wrongly inserted carrier tape 7 from the first conveying route 20*c*.

<<Tape Stopper Part>>

The configuration of the tape stopper part 24 will next be described with reference to FIG. 16 to FIG. 18. The tape stopper part 24 stops the traveling into the third conveying route 20*e* of the secondary tape 7*s* inserted into the first conveying route 20*c* when the primary tape 7*p* is currently conveyed in the second conveying route 20*d* and the third conveying route 20*e*.

The tape stopper part 24 includes a stopper 24*a*, a lever 24*b*, and a fifth sensor Sa5.

The stopper 24*a* is, for example, a plate-like member and is displaceable to a stop position P6 (see FIG. 17) with which the traveling of the secondary tape 7*s* is stopped and a stopper release position P7 (see FIG. 18) with which the stoppage of the traveling of the secondary tape 7*s* is released. The stopper 24*a* includes an abutting part 24*aa*, a tip portion 24*ab*, and a fulcrum 24*ac*. When the stopper 24*a* is at the stop position P6 that is a predetermined position in the first conveying route 20*c*, the abutting part 24*aa* abuts the tip of the secondary tape 7*s* to prevent the secondary tape 7*s* from moving to the downstream side along the first conveying route 20*c*.

The tip portion 24*ab* is the portion on the downstream side of the stopper 24*a* and is a transmission destination part that receives, from the lever 24*b*, the motivity for the displacement from the stop position P6 to the stopper release position P7.

The fulcrum 24*ac* is the fulcrum to be the rotation center for the stopper 24*a* to be displaced by rotations to the stop position P6 and the stopper release position P7. The fulcrum 24*ac* is positioned above the first conveying route 20*c* and more upstream than the abutting part 24*aa* is.

The lever 24*b* function a driving part that causes the stopper 24*a* to move to the stop position P6 and the stopper release position P7. The lever 24*b* itself is a link and includes a tape pressing part 24*ba*, a tip portion 24*bb*, a pawl part 24*bc*, and a fulcrum 24*bd*.

The tape pressing part 24*ba* presses from above the primary tape 7*p* that is conveyed in the third conveying route 20*e*. The coil spring 24*c* biases the tape pressing part 24*ba* to be pushed out downward. The primary tape 7*p* travels downstream and thereby counteracts the spring force of the coil spring 24*c* to lift up the tape pressing part 24*ba*.

In the state where the primary tape 7*p* lifts up the tape pressing part 24*ba*, the pawl part 24*bc* extending upward from the upper portion of the lever 24*b* is detected by the fifth sensor Sa5. In this state, the tip portion 24*bb* on the upstream side of the lever 24*b* is lowered downward and the tip portion 24*bb* supports the weight of the tip portion 24*ab* itself of the lever 24*a*.

As shown in FIG. 18, when the overall primary tape 7*p* is conveyed to the downstream side, the tape pressing part 24*ba* is rotated clockwise by the spring force of the coil spring 24*c* to contact the third conveying route 20*e*. The lever 24*b* is thereby rotated clockwise centering the fulcrum 24*bd* and the tip portion 24*bb* of the lever 24*b* causes the tip portion 24*ab* of the stopper 24*a* to rotate counterclockwise. The tip portion 24*bb* functions as a motivity transmitting part that transmits the rotation motivity to the tip portion 24*ab* of the stopper 24*a*. As a result, the stopper 24*a* rotates to be displaced from the stop position P6 to the stopper release position P7, and the abutting of the abutting part 24*aa* to the secondary tape 7*s* is released. At this time, the direction of the release of the abutting part 24*aa* from the stop position P6 to the stopper release position P7 is the direction of the traveling of the secondary tape 7*s*. In other words, the abutting part 24*aa* rotates in the direction to be distant from the tip of the secondary tape 7*s*, from the stop position p6 to the stopper release position P7, the tip of the secondary tape 7*s* can be therefore prevented from being squashed by the abutting part 24*aa*, and any clogging of the secondary tape 7*s* can also be prevented when the stopper 24*a* is released.

The transmission of the detection signal from the fifth sensor Sa5 to the feeder controller 28 is ceased by the rotation of the lever 24*b*. When the reception of the detection signal by the feeder controller 28 from the fifth sensor Sa5 ceases, the feeder controller 28 recognizes that the overall primary tape 7*p* is already conveyed to the downstream side and that the stopper 24*a* is positioned at the stopper release position P7.

To cause the secondary tape 7*s* to be conveyed to the third conveying route 20*e*, the feeder controller 28 next drives the second tape conveying part 23 to convey the secondary tape 7*s* to the downstream side. In this manner, the secondary tape 7*s* following the primary tape 7*p* can consecutively be conveyed.

The configuration of the control system of the tape feeder 6 will next be described with reference to FIG. 19. The feeder controller 28 included by the tape feeder 6 includes a computing device that includes a semiconductor element such as, for example, a processor or an FPGA, a storing device that includes, for example, a hard disc (HD), a memory, or an SSD, and a communicator 28*a*. The function of the feeder controller 28 may be configured by hardware alone or may be realized by combining hardware and software. The feeder controller 28 may realize the function determined in advance, by reading data and programs stored in the storing device and executing therefor various types of computing process. The communicator 28*a* is a communication interface and executes transmission and reception of signals and data with the attachment controller 10 included by the component attaching apparatus 1. Based on the detection results by the first sensor Sa1, the second sensor Sa2, and the third sensor Sa3, the feeder controller 28 controls the first motor 21*b* and the second motor 23*a* to execute, following a predetermined control pattern, the tape conveyance operation for the carrier tape 7 and the tape release operation of the tape holding releasing mechanism 34.

The feeder controller 28 drives and controls the solenoid 46 based on the result of the comparison of the identifier 8*a* of the reel 8 from the attachment controller 10. When the feeder controller 28 receives the detection signal from the fourth sensor Sa4, the feeder controller 28 recognizes that the shutter 27*a* is opened and that the secondary tape 7*s* is conveyed under the shutter 27*a* along the first conveying route 20*c*.

When the feeder controller 28 becomes unable to receive the detection signal from the fifth sensor Sa5, the feeder controller 28 recognizes that the overall primary tape 7*p* is already conveyed from the second conveying route 20*d* to the downstream side.

A tape conveyance operation by the tape feeder 6 will next be described with reference to FIG. 2 and FIG. 20. FIG. 20 is a flowchart showing the flow of the tape supply by the tape feeder 6.

At step S1, in the state where the carrier tape 7 is not supplied to the tape feeder 6, the worker inserts the carrier tape 7 from the insertion inlet 20a into the first conveying route 20c.

In parallel to step S1, the collator 10a of the attachment controller 10 compares the identifier 8a of the reel 8 read from the reader device 15, with the component information stored in the storage 10b to determine whether the components in the carrier tape 7 inserted into the first conveying route 20c are the correct components. The attachment controller 10 transmits the comparison result by the collator 10a to the feeder controller 28.

At step S2, when the feeder controller 28 receives the comparison result (a signal indicating the match) indicating that the components in the carrier tape 7 are the correct components, from the attachment controller 10, the feeder controller 28 drives the solenoid 46 to release the lock by the lock part 45. When the lock is released, the worker further inserts the carrier tape 7 into the tape conveying path 20 through the first conveying route 20c and, when the first sensor Sa1 detects the tip of the carrier tape 7, the first sensor Sa1 transmits the detection signal to the feeder controller 28. When the feeder controller 28 receives the comparison result (a signal indicating non-match) indicating that the components in the carrier tape 7 are not the correct components, from the attachment controller 10, the operation display panel 29 displays the comparison result indicating that the components are not the correct components to thereby inform the worker of the comparison result.

At step S3, when the feeder controller 28 receives the detection signal from the first sensor Sa1, the feeder controller 28 rotates forward the second motor 23a. The second sprocket 23g is thereby rotated to convey the carrier tape 7 in the downstream direction. At the timing of releasing the lock by the lock part 45, the feeder controller 28 may execute step S3 to rotate forward the second motor 23a to convey the carrier tape 7 in the downstream direction.

When the carrier tape 7 is conveyed in the tape conveying path 20 in the downstream direction and the second sensor Sa2 detects the tip of the carrier tape 7, the second sensor Sa2 transmits the detection signal to the feeder controller 28.

At step S4, when the feeder controller 28 receives the detection signal from the second sensor Sa2, the feeder controller 28 lowers the rotation speed of the second motor 23a and, after a time period determined in advance elapses, stops the second motor 23a. The carrier tape 7 thereby already reaches the first sprocket 21a. When the feeder controller 28 next rotates forward the first motor 21b to rotate the first sprocket 21a, the first sprocket 21a engages with the carrier tape 7. The carrier tape 7 is therefore handed over to the first sprocket 21a. The feeder controller 28 drives the first motor 21b to rotate to cause the first sprocket 21a to pitch-feed the carrier tape 7 at predetermined pitches. In this manner, the feeder controller 28 executes the switching between the sprockets to convey the carrier tape 7.

When the carrier tape 7 is pitch-fed by the first sprocket 21a and the third sensor Sa3 detects the tip of the carrier tape 7, the third sensor Sa3 transmits the detection signal to the feeder controller 28. When the feeder controller 28 receives the detection signal from the third sensor Sa3, the feeder controller 28 stops the first motor 21b.

At step S5, the feeder controller 28 next causes the second motor 23a to rotate backward to rotate clockwise the ratchet gear 35a. The lever 36 of the tape holding releasing mechanism 34 is thereby swung, the second support part 31 of the tape holding part 26 moves upward, and the carrier tape 7 drops onto the second conveying route 20d.

At step S6, the feeder controller 28 next causes the second motor 23a to rotate backward for a time period determined in advance and thereafter stops the second motor 23a. At this timing, the feeder controller 28 executes the peeling operation for the carrier tape 7.

At step S7, the feeder controller 28 next causes the second motor 23a to rotate forward to cause the ratchet gear 35a to rotate clockwise. The lever 36 of the tape holding releasing mechanism 34 is thereby swung and returns to the original position thereof, and the second support part 31 of the tape holding part 26 moves downward to return to the tape holding position that is the original position thereof. The primary tape 7p inserted ahead into the tape feeder 6 thereby passes through the tape conveying path 20 from the second conveying route 20d and engages with the first sprocket 21a, and the secondary tape 7s to next supply the components can therefore be inserted into the tape holding part 26 any time during the time period in which the components in the primary tape 7p are taken out by the attaching head 4 of the component attaching apparatus 1.

According to the tape feeder 6 of this embodiment, the tape feeder 6 includes the tape conveying path 20 that includes the first conveying route 20c into which the carrier tape 7 is inserted and the second conveying route 20d that is positioned under the first conveying route 20c, both on the upstream side thereof, and that has the second conveying route 20d and the first conveying route 20c joining each other therein to guide the traveling of the carrier tape 7 in the downstream direction, The tape feeder 6 further includes the first tape conveying part 21 that sequentially conveys the carrier tape 7 in the tape conveying path 20 that is present more downstream than the position P2 is at which the first conveying route 20c and the second conveying route 20d join each other, to the component taking out position P1 in the tape conveying path 20, and the tape holding part 26 that holds the carrier tape 7 in at least a portion of the first conveying route 20c. The tape feeder 6 further includes the second tape conveying part 23 that conveys the carrier tape 7 held by the tape holding part 26, in the downstream direction of the tape conveying path 20, and the tape holding releasing mechanism 34 that causes the carrier tape 7 held by the tape holding part 26 to drop from the first conveying route 20c onto the second conveying route 20d. The tape holding releasing mechanism 34 operates by using the motivity of the driving source of the second tape conveying part 23.

As above, in the tape feeder 6 of this embodiment, the tape holding releasing mechanism 34 causes the carrier tape 7 inserted into the first conveying route 20c to automatically drop onto the second conveying route 20d, and stoppage of the component supply due to the fact that the worker forgets to execute the tape discharge work can therefore be prevented. The productivity of mounting substrates can thereby be improved and the component supply to a component attaching apparatus can be automated or workers therefor can be reduced.

The second tape conveying part 23 of this embodiment includes the second motor 23a capable of rotating forward and backward, as the driving source thereof, and, when the second motor 23a rotates forward, the second tape conveying part 23 conveys the carrier tape 7 in the downstream direction of the tape conveying path 20 and, when the second motor 23a rotates backward, the tape holding releasing mechanism 34 is thereby driven.

Reduction of the space in the tape feeder 6 can thereby be facilitated because the second motor 23a of the second tape conveying part 23 that conveys the carrier tape 7 is used as the driving source of the tape holding releasing mechanism 34.

The tape holding part 26 of this embodiment is displaceable from the holding position with which the carrier tape 7 is held, to the release position P3 with which the holding of the carrier tape 7 is released, and the tape holding releasing mechanism 34 displaces the tape holding part 26 to the release position P3.

The tape holding releasing mechanism 34 of this embodiment includes the ratchet mechanism 35 that is rotated by the driving force of the second motor 23*a*, and the lever 36 that is swung by the ratchet mechanism 35, and the tape holding part 26 is displaced to the holding position or the release position P3 by the swinging of the lever 36.

The tape holding part 26 is maintained to be at the holding position or the release position P3 as far as the rotation direction of the second motor 23*a* is not changed because the lever 36 is swung by the ratchet mechanism 35.

According to the tape feeder 6 of this embodiment, the tape feeder 6 includes the feeder controller 28 that drives the tape holding releasing mechanism 34 at the timing after the carrier tape 7 conveyed by the second tape conveying part 23 is handed over to the first tape conveying part 21.

Even when the carrier tape 7 is discharged from the first conveying route 20*c* to the second conveying route 20*d*, the carrier tape in the second conveying route can be pitch-fed by the first tape conveying part 21 as the preceding tape because the discharge occurs after the carrier tape 7 is handed over to the first tape conveying part 21. The carrier tape 7 as the subsequent tape can be inserted into the tape holding part 26 that is a portion of the first conveying route 20*c*, and the productivity of the mounting substrates can therefore be improved. The handing over of the carrier tape 7 from the second tape conveying part 23 to the first tape conveying part 21 may be the state where both of the first sprocket 21*a* of the first tape conveying part 21 and the second sprocket 23*g* engage with the carrier tape 7 respectively on the downstream side and the upstream side of the carrier tape 7, or may be the state where only the first sprocket 21*a* of the first tape conveying part 21 engages with the carrier tape 7.

According to the tape feeder 6 of this embodiment, the tape feeder 6 includes the first sensor Sa1 that detects that the carrier tape 7 is inserted into the tape conveying path 20, and the second sensor Sa2 that is disposed in the tape conveying path 20 more downstream than the first sensor Sa1 is and that detects that the carrier tape 7 reaches. The tape feeder 6 further includes the third sensor Sa3 that is disposed in the tape conveying path 20 more downstream than the second sensor Sa2 is and that detects that the carrier tape 7 reaches the component taking out position P1. The feeder controller 28 starts up the second tape conveying part 23 based on the detection result indicating that the first sensor Sa1 detects the carrier tape 7, and stops the second tape conveying part 23 and further starts up the first tape conveying part 21 at the timing, determined in advance, after the second sensor Sa2 detects the carrier tape 7.

The position of the carrier tape 7 conveyed along the conveying path 20 can thereby be detected and the carrier tape 7 can highly precisely be handed over from the second tape conveying part 23 to the first tape conveying part 21.

The feeder controller 28 of this embodiment stops the first tape conveying part 21 and drives the tape holding releasing mechanism 34 based on the detection result indicating that the third sensor Sa3 detects the carrier tape 7. The tape conveying part 21 is thereby stopped and the tape holding releasing mechanism 34 is driven after the downstream side of the carrier tape 7 is handed over to the first tape conveying path 21, and the carrier tape 7 can therefore be prevented from being discharged during the conveyance thereof and the route change for the carrier tape 7 can be highly precisely executed.

According to the tape feeder 6 of this embodiment, the tape feeder 6 conveys the carrier tape 7 storing therein the components, to supply the components to the component attaching apparatus 1. The tape feeder 6 is disposed in the first conveying route 20*c* more downstream than the second sprocket 23*g* is, and includes the shutter 27*a* that prevents the carrier tape 7 from being conveyed downstream from the predetermined position, and the feeder controller 28 that drives and controls the second tape conveying part 23 based on the result of the comparison between the information on the components stored in the carrier tape 7 and the information on the components to be supplied that are determined in advance. The shutter 27*a* is moved by the carrier tape 7 that is conveyed by the second tape conveying part 23 from the tape stop position P4 to stop the traveling of the carrier tape 7 to the retreat position P5 distant from the tape stop position P4.

The feeder controller 28 can thereby control the conveyance of the carrier tape 7 based on the result of the comparison between the information on the components stored in the carrier tape 7 and the information on the components to be supplied, the worker does not therefore need to further insert the carrier tape 7 after the comparison, the standby time of the worker can be reduced, and the work efficiency can be improved.

The tape feeder 6 of this embodiment includes the lock part 45 that locks the shutter 27*a*, and the feeder controller 28 releases the lock of the shutter 27*a* by the lock part 45 based on the result of the comparison and causes the second tape conveying part 23 to convey the carrier tape 7.

The feeder controller 28 thereby releases the lock of the shutter 27*a* by the lock part 45 based on the result of the comparison, and only the carrier tapes 7 each storing therein the correct components can be conveyed.

According to the tape feeder 6 of this embodiment, the tape feeder 6 includes the fourth sensor Sa4 that detects the displacement of the shutter 27*a*. The shutter 27*a* whose lock is released is displaced by the carrier tape 7 conveyed in the first conveying route 20*c*, and the feeder controller 28 recognizes that the carrier tape 7 is replenished to the tape feeder 6 based on the detection of the displacement of the shutter 27*a* by the fourth sensor Sa4.

The feeder controller 28 thereby recognizes that the secondary tape 7*s* is already set also after all the components in the primary tape 7*p* are supplied, and the components can therefore be consecutively supplied to the component attaching apparatus 1.

According to the tape feeder 6 of this embodiment, the tape feeder 6 includes the stopper 24*a* that includes the abutting part 24*aa* that abuts the tip of the secondary tape 7*s* at the predetermined position in the first conveying route 20*c* and that is movable to the stop position P6 with which the secondary tape 7*s* is stopped at the predetermined position and the stopper release position P7 with which the secondary tape 7*s* can be conveyed downward from the stop position P6, and the lever 24*b* that moves the stopper 24*a* to the stop position P6 and the stopper release position P7. When the abutting part 24*aa* moves from the stop position P6 to the stopper release position P7, the abutting part 24*aa* leaves the tip of the secondary tape 7*s* along the conveyance direction of the secondary tape 7*s*.

When the abutting part 24*aa* moves to the stopper release position P7, the abutting part 24*aa* can thereby be prevented from squashing into the secondary tape 7*s*, and the conveyance of the secondary tape 7*s* can smoothly be executed.

According to the tape feeder 6 of this embodiment, the tape feeder 6 includes the fulcrum 24*ac* that supports the stopper 24*a* to be rotatable, the abutting part 24*aa* is disposed more downstream in the conveyance direction of the secondary tape 7*s* than the fulcrum 24*ac* is, and the lever 24*b* rotates upward the stopper 24*a*.

When the abutting part 24*aa* moves from the predetermined position to the stopper release position P7, the abutting part 24 can properly leave the tip of the secondary tape 7*s* along the conveyance direction of the secondary tape 7*s*.

According to the tape feeder 6 of this embodiment, the lever 24*b* includes the tip portion 24*bb* that includes the link, and the stoper 24*a* includes the tip portion 24*ab* that receives the motivity from the tip portion 24*bb*.

The driving force of the lever 24*b* can thereby be properly transmitted to the stopper 24*a*.

The present disclosure has been sufficiently described in relation to the preferred embodiment with reference to the accompanying drawings while various modifications and corrections are obvious to those skilled in the art. It should be understood that those modifications and corrections are encompassed in the scope of the present disclosure by the appended claims without departing therefrom. Changes of the combinations of the elements and the order thereof in the embodiments are realizable without departing from the scope and the idea of the present disclosure.

(1) In the embodiment, the tape holding releasing mechanism 34 pushes down the movable member 33 using the lever 36 while the configuration is not limited to the above. As shown in FIG. 21 and FIG. 22, the movable member 33 may be hoisted up by the lever 36 using a link mechanism. In FIG. 21, the movable member 33 is at the position with which the carrier tape 7 is held by the second support part 31. In FIG. 22, the movable member is at the position at which the movable member is hoisted up by the lever 36 and drops from the second support part 31.

(2) In the embodiment, the carrier tape 7 held by the tape holding part 26 is released by the upward move of the movable member while the configuration is not limited to the above. The move of the lever 36 in the up-and-down direction may be converted into a move in the lateral direction using, for example, a cam mechanism. As shown in FIG. 23, a tape holding part 26A includes a left side wall 32*a* on which the first support part 30 is fixed, and a right side wall 32*b* on which the second support part 31 is fixed. FIG. 23 is an explanatory view explaining the release of the carrier tape 7 in a modification example, (a) showing the state where the carrier tape 7 is held, (b) showing the state where the carrier tape 7 is dropped by the displacement of each of the left side wall 32*a* and the right side wall 32*b*, (c) showing the state where the left side wall 32*a* and the right side wall 32*b* each return to the tape holding position that is the original positions thereof. The tape holding releasing mechanism 34 displaces the left side wall 32*a* and the right side wall 32*b* and thereby displaces the first support part 30 and the second support part 31 to the release position P3 that is laterally distant from the first conveying route 20*c*.

In the case where the tape holding part 26A causes the carrier tape 7 to drop using the displacement of each of the left side wall 32*a* and the right side wall 32*b* as above, the length of each of the first support part 30 and the second support part 31 can be increased and the tape holding part 26A is suitable for conveying carrier tapes 7 each having a large width.

By combining as necessary optional embodiments or modification examples of the above various embodiments and the modification examples with each other, their respective effects can be achieved.

INDUSTRIAL APPLICABILITY

The component supply apparatus according to the present disclosure is applicable to a component supply apparatus that supplies components to a component attaching apparatus attaching the components to substrates.

EXPLANATION OF REFERENCES

1 component attaching apparatus
1*a* base stand
2 substrate conveying mechanism
3 substrate
4 attaching head
5 wheeled platform
6 tape feeder
6*a* base part
7 carrier tape
7*e* empty tape
7*h* hole
7*p* primary tape
7*s* secondary tape
7*t* terminal part
8 reel
8*a* identifier
9 reel holding part
10 attachment controller
10*a* collator
10*b* storage
11 main body cover
12 collection box
13 discharge chute
14 cutting part
15 reader device
20 tape conveying path
20*a* insertion inlet
20*b* discharge outlet
20*c* first conveying route
20*d* second conveying route
20*e* third conveying route
21 first tape conveying part
21*a* first sprocket
21*b* first motor
22 tape cover
23 second tape conveying part
23*a* second motor
23*b* first gear
23*c* second gear
23*d* third gear
23*e* fourth gear
23*f* fifth gear
23*g* second sprocket
24 tape stopper part
24*a* stopper
24*aa* abutting part
24*ab* tip portion
24*ac* fulcrum
24*b* lever
24*ba* tape pressing part

21

24*bb* tip portion
24*bd* fulcrum
24*c* coil spring
26, 26A tape holding part
26*a* rotating shaft
27 shutter unit
27*a* shutter
27*b* pin
27*c* coil spring
27*e* shutter main body
27*ea* inclined part
27*eb* elongated hole
27*f* plate-like member
28 feeder controller
28*a* communicator
29 operation display panel
30 first support part
31 second support part
31*a* cutout portion
32*a* left side wall
32*b* right side wall
33 movable member
33*a* elongated hole
34 tape holding releasing mechanism
35 ratchet mechanism
35*a* ratchet gear
35*b* ratchet pawl
36 lever
38 hand grip
39 rotating shaft
40 one-way clutch
41 pin
42 protrusion
42*a* taper
43 side cover
45 lock part
46 solenoid
46*a* plunger
46*b* plate member
47 lever
47*a*, 47*b* end
48 coil spring
P1 component taking out position
P2 joining position
P3 release position
P4 tape stop position
P5 retreat position
P6 stop position
P7 stopper release position
Sa1 first sensor
Sa2 second sensor
Sa3 third sensor
Sa4 fourth sensor
Sa5 fifth sensor

The invention claimed is:

1. A component supply apparatus comprising:
a tape conveying path that comprises a first conveying route and a second conveying route, both of the first conveying route and the second conveying route are disposed on an upstream side thereof:
a first conveying route into which a carrier tape is inserted; and
a second conveying route that is positioned under the first conveying route, the first conveying route and the second conveying route joining each other to guide traveling of the carrier tape in a downstream direction;

22 a first tape conveying part that sequentially conveys the carrier tape and is disposed closer to a component taking out position in the tape conveying path than a position at which the first conveying route and the second conveying route join each other;
a tape holding part that holds the carrier tape in at least a portion of the first conveying route;
a second tape conveying part comprises a motor configured to rotate a sprocket for conveying the carrier tape held by the tape holding part, in the downstream direction of the tape conveying path; and
a tape holding releasing mechanism that causes the carrier tape held by the tape holding part to drop from the first conveying route onto the second conveying route, wherein
the motor of the second tape conveying part drives the tape holding releasing mechanism.

2. The component supply apparatus according to claim 1, wherein
the motor is configured to rotate forward and backward as the driving source, wherein
when the motor rotates forward, the second tape conveying part conveys the carrier tape in the downstream direction of the tape conveying path, and wherein
when the motor rotates backward, the tape holding releasing mechanism is thereby driven.

3. The component supply apparatus according to claim 2, wherein
the tape holding part is displaceable from a holding position at which the holding part holds the carrier tape to a release position at which the holding part releases the holding of the carrier tape, and wherein
the tape holding releasing mechanism displaces the tape holding part to the release position.

4. The component supply apparatus according to claim 3, wherein
the tape holding releasing mechanism comprises:
a ratchet mechanism that is rotated by a driving force of the motor; and
a lever that is swung by the ratchet mechanism, and wherein
the tape holding part is displaced to the holding position or the release position by the swinging of the lever.

5. The component supply apparatus according to claim 4, wherein
the release position is a position that is distant upward from the first conveying route.

6. The component supply apparatus according to claim 5, wherein
the tape holding part comprises:
a movable member that is swingable by the tape holding releasing mechanism;
a first support part that supports one lower portion in a width direction of the carrier tape; and
a second support part that supports another lower portion in the width direction of the carrier tape, the second support part being fixed on the movable member, and wherein
the tape holding releasing mechanism swings the movable member to thereby displace the second support part to the position distant upward from the first conveying route.

7. The component supply apparatus according to claim 6, wherein
the ratchet mechanism comprises:
a ratchet gear that is rotated by the driving force of the motor; and the lever comprising ratchet pawls that engage with the ratchet gear, wherein the lever is connected to an end on the downstream side, of the movable member, and wherein when the motor rotates backward, the ratchet gear engages with the ratchet pawls to swing the lever to thereby swing the movable member.

8. The component supply apparatus according to claim 4, wherein the release position is a position that is distant in a lateral direction from the first conveying route.

9. The component supply apparatus according to claim 8, wherein the tape holding part comprises:

a first side wall and a second side wall that are each displaceable in a horizontal direction by the tape holding releasing mechanism;

a first support part that supports one lower portion in a width direction of the carrier tape, the first support part being fixed on the first side wall; and a second support part that supports another lower portion in the width direction of the carrier tape, and wherein the tape holding releasing mechanism displaces the first side wall and the second side wall to thereby displace the first support part and the second support part to positions distant in the lateral direction from the first conveying route.

10. The component supply apparatus according to claim 9, wherein the ratchet mechanism comprises:

a ratchet gear that is rotated by the driving force of the motor; and a lever comprising ratchet pawls that engage with the ratchet gear, and wherein when the motor rotates backward, the ratchet gear engages with the ratchet pawls to swing the lever to thereby displace the first side wall and the second side wall.

* * * * *